(12) United States Patent
Lee et al.

(10) Patent No.: US 10,332,842 B2
(45) Date of Patent: Jun. 25, 2019

(54) SEMICONDUCTOR DEVICES WITH ALIGNMENT KEYS

(71) Applicant: SAMSUNG ELECTRONICS CO., LTD., Suwon-si, Gyeonggi-Do (KR)

(72) Inventors: Kiseok Lee, Hwaseong-si (KR); Sooho Shin, Hwaseong-si (KR); Juik Lee, Anyang-si (KR); Jun Ho Lee, Hwaseong-si (KR); Kwangmin Kim, Hwaseong-si (KR); Ilyoung Moon, Yongin-si (KR); Jemin Park, Suwon-si (KR); Bumseok Seo, Yongin-si (KR); Chan-Sic Yoon, Anyang-si (KR); Hoin Lee, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/026,937

(22) Filed: Jul. 3, 2018

(65) Prior Publication Data

US 2018/0331046 A1    Nov. 15, 2018

Related U.S. Application Data

(62) Division of application No. 15/608,747, filed on May 30, 2017, now Pat. No. 10,026,694.

(30) Foreign Application Priority Data

Sep. 30, 2016 (KR) .................. 10-2016-0127011

(51) Int. Cl.
*H01L 23/544* (2006.01)
*H01L 27/108* (2006.01)

(52) U.S. Cl.
CPC ...... *H01L 23/544* (2013.01); *H01L 27/10814* (2013.01); *H01L 27/10823* (2013.01); *H01L 27/10876* (2013.01); *H01L 27/10885* (2013.01); *H01L 27/10894* (2013.01); *H01L 27/10897* (2013.01); *H01L 2223/5442* (2013.01);

(Continued)

(58) Field of Classification Search
CPC .................................................. H01L 23/544
See application file for complete search history.

(56) References Cited

U.S. PATENT DOCUMENTS

| 6,673,635 B1 | 1/2004 | Hellig et al. |
| 2006/0064676 A1 | 3/2006 | Chavan |
| 2010/0001380 A1 | 1/2010 | Iguchi et al. |

(Continued)

*Primary Examiner* — Walter H Swanson
(74) *Attorney, Agent, or Firm* — F. Chau & Associates, LLC

(57) ABSTRACT

A semiconductor device includes an alignment key on a substrate. The alignment key includes a first sub-alignment key pattern with a first conductive pattern, a second conductive pattern, and a capping dielectric pattern that are sequentially stacked on the substrate, an alignment key trench that penetrates at least a portion of the first sub-alignment key pattern, and a lower conductive pattern in the alignment key trench. The alignment key trench includes an upper trench that is provided in the capping dielectric pattern that has a first width, and a lower trench that extends downward from the upper trench and that has a second width less than the first width. The lower conductive pattern includes sidewall conductive patterns that are separately disposed on opposite sidewalls of the lower trench.

12 Claims, 28 Drawing Sheets

(52) U.S. Cl.
CPC ............... *H01L 2223/5446* (2013.01); *H01L 2223/54426* (2013.01)

(56) References Cited

U.S. PATENT DOCUMENTS

| | | |
|---|---|---|
| 2015/0170994 A1 | 6/2015 | Gong et al. |
| 2015/0348945 A1* | 12/2015 | Or-Bach ............... H01L 21/743 257/384 |
| 2017/0110409 A1 | 4/2017 | Kuo et al. |
| 2018/0096947 A1 | 4/2018 | Lee et al. |

* cited by examiner (Comparative Example)

(Comparative Example)

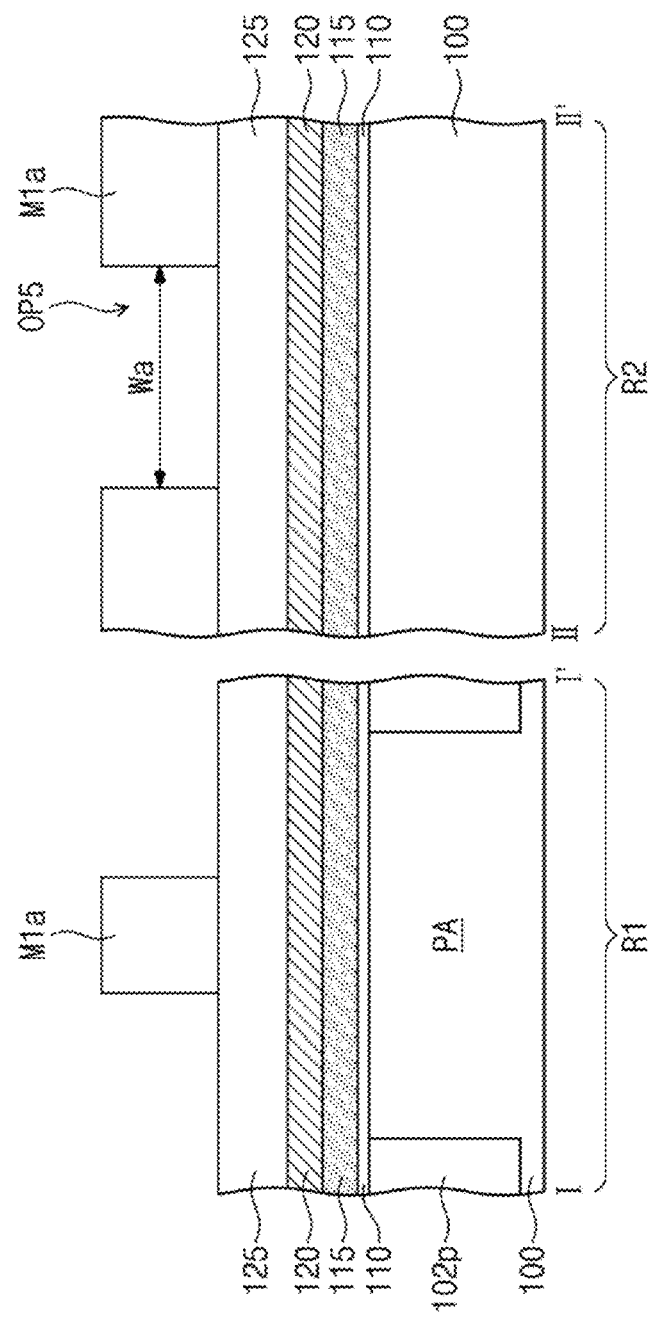

SEMICONDUCTOR DEVICES WITH ALIGNMENT KEYS

CROSS-REFERENCE TO RELATED APPLICATIONS

This U.S. nonprovisional patent application is a divisional of U.S. patent application Ser. No. 15/608,747, filed on May 30, 2017 in the U.S. Patent and Trademark Office, which in turn claims priority under 35 U.S.C. § 119 from, and the benefit of, Korean Patent Application 10-2016-0127011, filed on Sep. 30, 2016 in the Korean Intellectual Property Office, the contents of which are herein incorporated by reference in their entirety.

BACKGROUND

Technical Field

Embodiments of the present inventive concept are directed to a semiconductor device, and more particularly, to a semiconductor memory device that includes an alignment key.

Discussion of Related Art

Semiconductor devices have become increasingly integrated with the development of the electronics industry. It is challenging to fabricate a semiconductor device because of reduced process margins in an exposure process that defines fine patterns. High speed semiconductor devices are increasingly in demand with the development of the electronics industry, and the development of high speed and more highly integrated semiconductor device has been the subject of much research.

In general, to fabricate a semiconductor device, a predetermined material layer is formed on a semiconductor substrate, i.e., a wafer, and then a photolithography process is performed to form a desired pattern. The photolithography process is carried out to form a pattern by forming a photoresist layer on the semiconductor substrate on which the predetermined layer is formed, forming a photoresist pattern by exposing and developing the photoresist layer using a mask, and then etching the predetermined layer using the photoresist pattern. The exposure process has an important role in determining the fabrication accuracy of a method for the semiconductor device. When the exposure process is utilized to form a predetermined pattern on the semiconductor substrate, a photo alignment key is used to exactly align an exposure mask.

SUMMARY

Embodiments of the present inventive concept can provide a semiconductor device having enhanced process yield and reliability.

According to exemplary embodiments of the present inventive concept, a semiconductor device includes an alignment key on a substrate. The alignment key comprises a first sub-alignment key pattern that includes a first conductive pattern, a second conductive pattern, and a capping dielectric pattern that are sequentially stacked on the substrate; an alignment key trench that penetrates at least a portion of the first sub-alignment key pattern; and a lower conductive pattern in the alignment key trench. The alignment key trench comprises an upper trench provided in the capping dielectric pattern that has a first width; and a lower trench that extends downward from the upper trench that has a second width less than the first width. The lower conductive pattern includes sidewall conductive patterns that are separately disposed on opposite sidewalls of the lower trench.

According to exemplary embodiments of the present inventive concept, a semiconductor device comprises a substrate that includes a chip zone and a scribe lane zone; a gate line on the chip zone; and an alignment key on the scribe lane zone. The gate line includes a gate dielectric pattern, a lower gate pattern, an upper gate pattern, and a gate capping pattern that are sequentially stacked on the substrate. The alignment key comprises a first sub-alignment key pattern that includes a buffer dielectric pattern, a first conductive pattern, a second conductive pattern, and a capping dielectric pattern that are sequentially stacked on the substrate; an alignment key trench that penetrates at least a portion of the first sub-alignment key pattern, the alignment key trench including an upper trench that vertically penetrates a portion of the capping dielectric pattern and has a first width and a lower trench that extends downward from the upper trench and has a second width less than the first width; and sidewall conductive patterns that are separately disposed on opposite sidewalk of the lower trench. The buffer dielectric pattern, the first conductive pattern, the second conductive pattern, and the capping dielectric pattern include the same materials, respectively, as the gate dielectric pattern, the lower gate pattern, the upper gate pattern, and the gate capping pattern.

According to exemplary embodiments of the present inventive concept, a method of fabricating a semiconductor device includes providing a substrate that includes a first region and a second region; sequentially forming a first dielectric layer, a lower conductive layer, an upper conductive layer, and a second dielectric layer on the substrate; forming a first mask pattern on the substrate that covers a portion of the second dielectric layer in the first region and completely covers the second dielectric layer in the second region, and etching the substrate using the first mask pattern as an etching mask wherein a gate line is formed in the first region of the substrate. The gate line includes a gate dielectric pattern, a lower gate pattern, an upper gate pattern, and a gate capping pattern that are respectively formed by patterning the first dielectric layer, the lower conductive layer, the upper conductive layer, and the second dielectric layer in the first region. The method further includes removing the first mask pattern; forming source/drain regions in the substrate on opposite sides of the gate line; forming a lower interlayer dielectric layer on the first region of the substrate; forming a second mask pattern on the substrate that has first openings on the first region that overlap the source/drain regions and a trench-shaped second opening on the second region; etching portions of the lower interlayer dielectric layer exposed through the first openings using the second mask pattern to form lower contact holes that penetrate the lower interlayer dielectric layer and expose the source/drain regions, wherein the second dielectric layer and the upper conductive layer of the second region are sequentially etched to form a preliminary alignment key trench that exposes the lower conductive layer; and removing the second mask pattern.

BRIEF DESCRIPTION OF THE DRAWINGS

FIGS. 19 to 22 are cross-sectional views, corresponding to lines I-I' and II-II' of FIG. 3, that illustrate a method of fabricating a semiconductor device according to exemplary embodiments of the present inventive concept.

DETAILED DESCRIPTION OF EXEMPLARY EMBODIMENTS

Hereinafter, exemplary embodiments of the present inventive concept will be described in detail with reference to the accompanying drawings.

Figure 1:
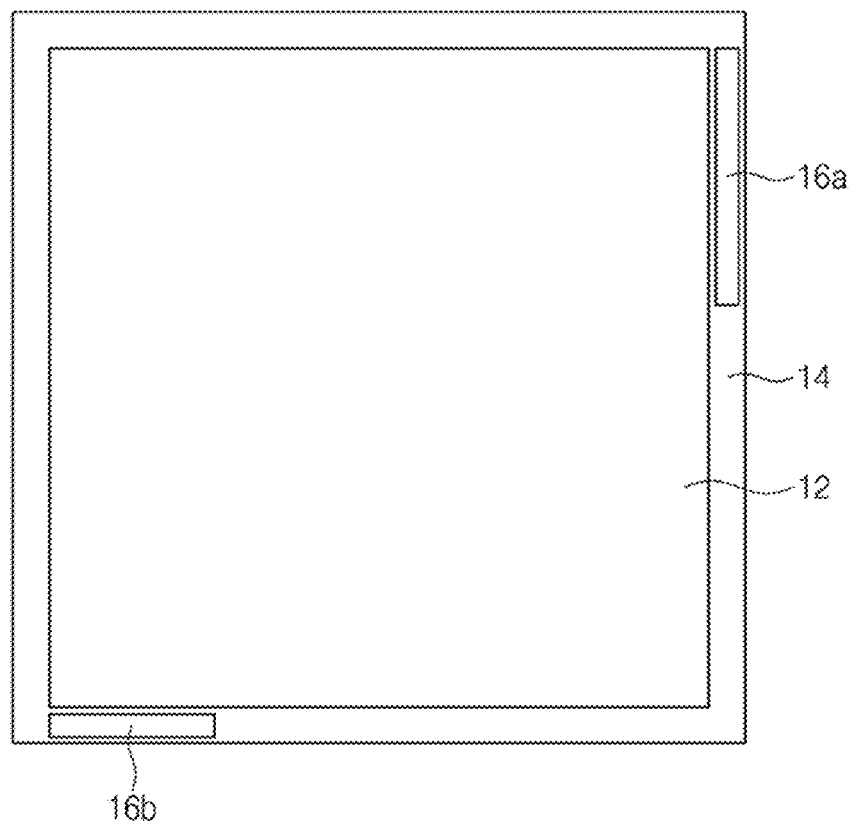
FIG. 1 is a simplified plan view that illustrates a semiconductor device according to exemplary embodiments of the present inventive concept.
Figure 2:
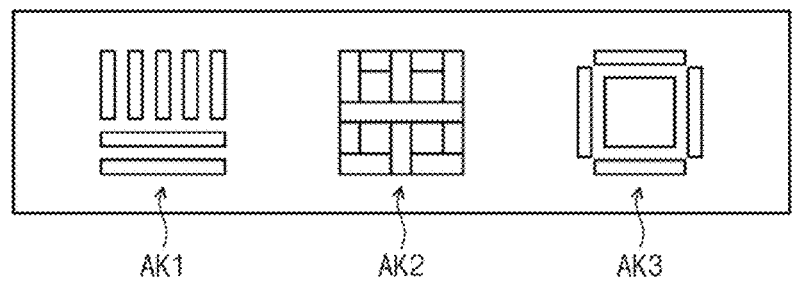
FIG. 2 is a plan view that illustrates shapes of photo alignment keys.

FIG. 1 is a simplified plan view that illustrates a semiconductor device according to exemplary embodiments of the present inventive concept. FIG. 2 is a plan view that illustrates shapes of photo alignment keys.

Referring to FIG. 1, a semiconductor device 10 according to an embodiment includes a chip zone 12 and a scribe lane zone 14. The chip zone 12 corresponds to one of a plurality of semiconductor chips formed on a semiconductor wafer, and the scribe lane zone 14 corresponds to a portion of scribe lane used to cut the semiconductor wafer into separate semiconductor chips after process steps that form the semiconductor chips on the semiconductor wafer have terminated. The chip zone 12 includes a cell region on which memory cells are formed and a peripheral circuit region on which peripheral circuits that control the memory cells are formed. For example, the chip zone 12 may include metal-oxide-semiconductor (MOS) transistors, a diode, or a resistor. The scribe lane zone 14 includes a test device group and photo alignment keys 16a and 16b, referred to hereinafter as alignment keys.

According to embodiments, the alignment keys 16a and 16b have a shape similar to that of cell, contact, or trench. As shown in FIG. 2, the alignment keys 16a and 16b have various patterns AK1, AK2, and AK3. In accordance with their purpose, the alignment keys 16a and 16b can be classified as a local alignment key, a global alignment key, a registration alignment key, an overlay alignment key, and a measurement key. A trench-type alignment key and a semiconductor device including the same will hereinafter be described in detail.

Figure 3:
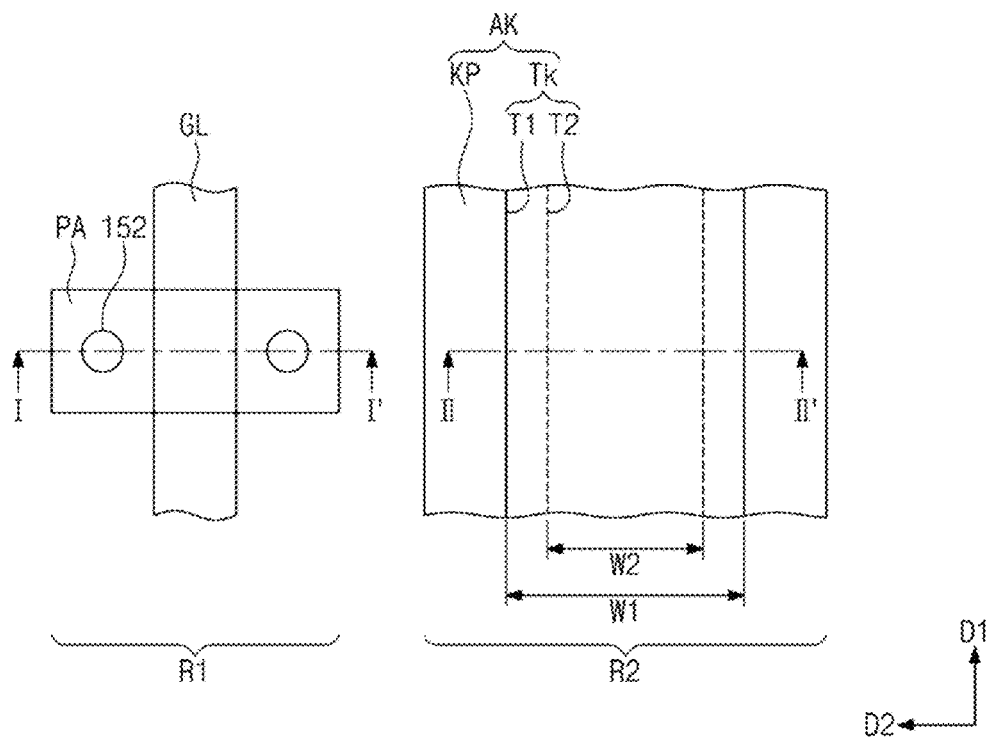
FIG. 3 is a plan view that partly illustrates a semiconductor device of FIG. 1.
Figure 4:
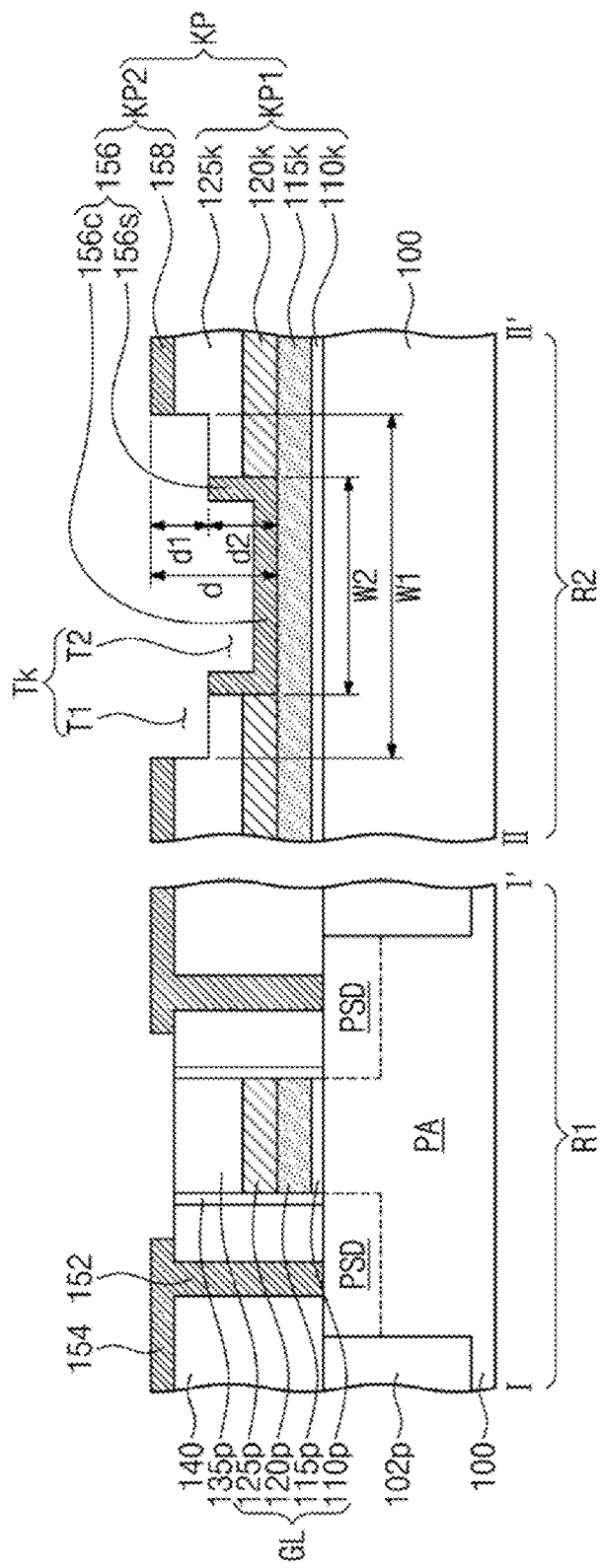
FIG. 4 is a cross-sectional view taken along lines I-I' and II-II' of FIG. 3.

FIG. 3 is a plan view that partly illustrates the semiconductor device of FIG. 1. FIG. 4 is a cross-sectional view taken along lines I-I' and II-II' and of FIG. 3.

Referring to FIGS. 3 and 4, according to embodiments, a substrate 100 includes a first region R1 and a second region R2. The substrate 100 is a semiconductor substrate such as a silicon substrate, a germanium substrate, or a silicon-germanium substrate. The first region R1 is a portion of the chip zone 12 of FIG. 1, and the second region R2 is a portion of the scribe lane zone 14 of FIG. 1.

According to embodiments, a gate line GL is disposed on the substrate 100 of the first region R1. For example, the gate line GL has a line or bar shape that extends in a first direction D1 and crosses an active region PA defined in the substrate 100 of the first region R1. In the first region R1, the substrate 100 includes the active region PA at an upper portion defined by a device isolation pattern 102p. The device isolation pattern 102p may include, for example, silicon oxide or silicon oxynitride. Although FIGS. 3 and 4 show one gate line GL, exemplary embodiments of the present inventive concept are not limited thereto.

According to embodiments, the gate line GL includes a gate dielectric pattern 110p, a lower gate pattern 115p, an upper gate pattern 120p, and a gate capping pattern 125p that are sequentially stacked. The gate dielectric pattern 110p includes an insulating material, for example, at least one of silicon oxide, silicon oxynitride, or a high-k dielectric such as a dielectric metal oxide such as hafnium oxide or aluminum oxide that have a dielectric constant greater than that of silicon oxide. The lower and upper gate patterns 115p and 120p include a conductive material. For example, the lower gate pattern 115p can include doped polysilicon and the upper gate pattern 120p includes at least one of a metal such as tungsten, aluminum, titanium, or tantalum, or a conductive metal nitride such as titanium nitride, tantalum nitride, or tungsten nitride. The gate capping pattern 125p includes an insulating material, such as silicon oxide, silicon nitride, or silicon oxynitride.

According to embodiments, the gate line GL is provided with gate spacers 135p on its sidewalls that extend in the first direction D1 along the gate line GL. The gate spacers 135p include at least one of silicon oxide, silicon nitride, or silicon oxynitride. Source/drain regions PSD are disposed in the active region PA on opposite sides of the gate line GL. The source/drain regions PSD are doped with p- or n-type impurities.

According to embodiments, a lower interlayer dielectric layer 140 is disposed on the substrate 100 of the first region R1. The lower interlayer dielectric layer 140 covers the sidewalls of the gate line GL. The lower interlayer dielectric layer 140 includes at least one of silicon oxide, silicon nitride, or silicon oxynitride. The lower interlayer dielectric layer 140 exposes a top surface of the gate line GL, but exemplary embodiments of the present inventive concept are not limited thereto.

According to embodiments, a lower contact plug 152 is disposed on at least one of opposite sides of the gate line GL, and penetrates the lower interlayer dielectric layer 140 to connect to one of the source/drain regions PSD. A lower interconnect line 154 connected to the lower contact plug 152 is disposed on the lower interlayer dielectric layer 140. The lower contact plug 152 and the lower interconnect line 154 include the same conductive material. For example, the lower contact plug 152 and the lower interconnect fine 154 can include at least one of a metal such as tungsten, titanium, or tantalum, or a conductive metal nitride such as titanium nitride, tantalum nitride, or tungsten nitride. In some embodiments, the lower contact plug 152 and the lower interconnect line 154 are simultaneously formed to constitute a single unitary structure.

According to embodiments, an alignment key AK is disposed on the substrate 100 of the second region R2. The alignment key AK includes an alignment key pattern KP and an alignment key trench Tk. The alignment key trench Tk vertically penetrates at least a portion of the alignment key pattern KP. In other words, the alignment key AK is a trench-type alignment key. Although the alignment key AK is illustrated as having one alignment key trench Tk, exemplary embodiments of the present inventive concept are not limited thereto. In some embodiments, the alignment key AK includes an alignment key pattern KP and a plurality of alignment key trenches Tk that penetrate the alignment key pattern KP.

According to embodiments, the alignment key pattern KP includes a first sub-alignment key pattern KP1 and a second sub-alignment key pattern KP2. The first sub-alignment key pattern KP1 includes a buffer dielectric pattern 110$k$, a first conductive pattern 115$k$, a second conductive pattern 120$k$, and a capping dielectric pattern 125$k$. In some embodiments, the alignment key trench Tk vertically penetrates a portion of the first sub-alignment key pattern KP1. For example, the alignment key trench Tk penetrates the capping dielectric pattern 125$k$ and the second conductive pattern 120$k$ to expose the first conductive pattern 115$k$ through the alignment key trench Tk.

According to a present inventive concept, the alignment key trench Tk includes portions having different widths from each other. For example, the alignment key trench Tk includes an upper trench T1 having a first width W1 and a lower trench T2 having a second width W2 less than the first width W1. The lower trench T2 extends downward from the upper trench T1. The first and second widths W1 and W2 of the alignment key trench Tk are measured in a second direction D2. The second direction D2 is, for example, perpendicular to the first direction D1. The upper trench T1 vertically penetrates a portion of the capping dielectric pattern 125$k$. In this configuration, the upper trench T1 is formed in the capping dielectric pattern 125$k$. The upper trench T1 has a depth d1 less than a thickness of the capping dielectric pattern 125$k$. The lower trench T2 extends from the upper trench Tk to penetrate the capping dielectric pattern 125$k$ and the second conductive pattern 120$k$, to expose the first conductive pattern 115$k$ through the lower trench T2. The alignment key trench Tk has a depth d of greater than or equal to about 30 nm, which is a sum of the depth d1 of the upper trench T1 and a depth d2 of the lower trench T2. For example, the depth d of the alignment key trench Tk is in the range from about 30 nm to about 500 nm. The width W2 of the lower trench T2 is greater than or equal to about 100 nm. For example, the width W2 of the lower trench T2 is in the range from about 100 nm to about 5,000 nm.

According to embodiments, the second sub-alignment key pattern KP2 includes a lower conductive pattern 156 and an upper conductive pattern 158. The lower conductive pattern 156 is disposed in the lower trench T2 and partially fills the lower trench T2. For example, the lower conductive pattern 156 includes sidewall conductive patterns 156$s$ disposed on sidewalls of the lower trench T2 and an interconnect conductive pattern 156$c$ that connects bottom ends of the sidewall conductive patterns 156$s$. The interconnect conductive pattern 156$c$ is in contact with the first conductive pattern 115$k$ exposed through the lower trench T2. The sidewall conductive patterns 156$s$ and the interconnect conductive pattern 156$c$ constitute a single unitary structure. The upper conductive pattern 158 is disposed on a top surface of the capping dielectric pattern 125$k$. The upper conductive pattern 158 has inner sidewalls aligned with sidewalls of the capping dielectric pattern 125$k$ that are exposed through the upper trench T1.

According to embodiments, the buffer dielectric pattern 110$k$, the first conductive pattern 115$k$, the second conductive pattern 120$k$, and the capping dielectric pattern 125$k$ of the first sub-alignment key pattern KP1 have the same materials, respectively, as the gate dielectric pattern 110$p$, the lower gate pattern 115$p$, the upper gate pattern 120$p$, and the gate capping pattern 125$p$ of the gate line GL. The buffer dielectric pattern 110$k$ includes at least one of, for example, silicon oxide, silicon oxynitride, or a high-k dielectric such as a dielectric metal oxide such as hafnium oxide or aluminum oxide that have a dielectric constant greater than that of silicon oxide. For example, the first conductive pattern 115$k$ includes doped polysilicon, and the second conductive pattern 120$k$ includes at least one of a metal such as tungsten, aluminum, titanium, or tantalum, or a conductive metal nitride such as titanium nitride, tantalum nitride, or tungsten nitride. The capping dielectric pattern 125$k$ may include, for example, silicon oxide, silicon nitride, or silicon oxynitride.

According to embodiments, the lower conductive pattern 156 and the upper conductive pattern 158 of the second sub-alignment key pattern KP2 include the same material as the lower contact plug 152 and the lower interconnect line 154. For example, the lower contact pattern 156 and the upper interconnect line 158 include at least one of a metal such as tungsten, titanium, or tantalum, or a conductive metal nitride such as titanium nitride, tantalum nitride, or tungsten nitride.

According to embodiments, during a method of fabricating a semiconductor device, the alignment key trench Tk is provided with mask layers with different etch selectivities which are removed after a patterning process that uses the mask layers. After removing the mask layers from the alignment key trench Tk, the mask layers may partially remain to act as lifting failure sources. In some embodiments, the alignment key AK are configured to suppress lifting failure. This will be described in detail in the following description of a method of fabricating a semiconductor device.

According to embodiments, an upper interlayer dielectric layer is disposed on an entire surface of the substrate 100. On the first region R1 the upper interlayer dielectric layer covers the lower interconnect line 154. On the second region R2, the upper interlayer dielectric layer fills the alignment key trench Tk. The upper interlayer dielectric layer includes silicon oxide, silicon nitride, or silicon oxynitride.

Figure 5A:
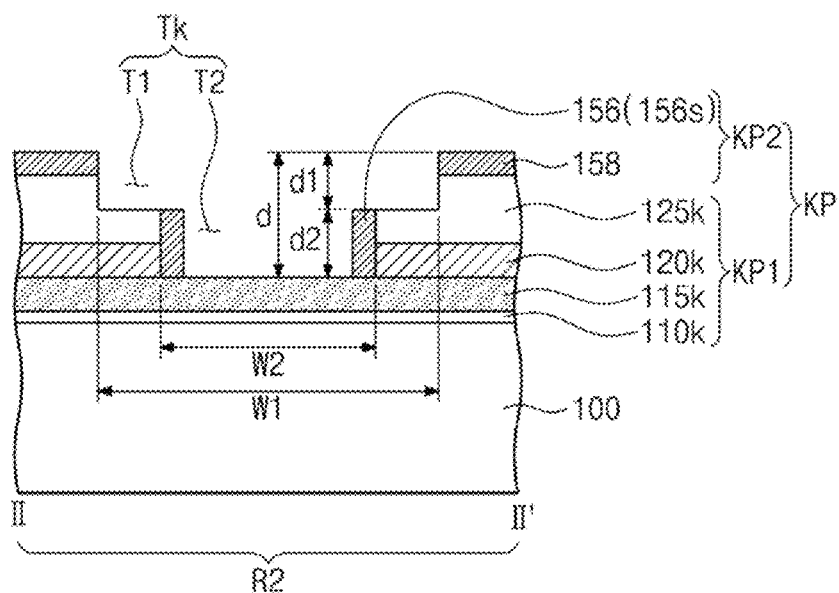
FIGS. 5A to 5C are cross-sectional views, corresponding to line II-II' of FIG. 3, that illustrate other examples of alignment keys shown in FIGS. 3 and 4.
Figure 5B:
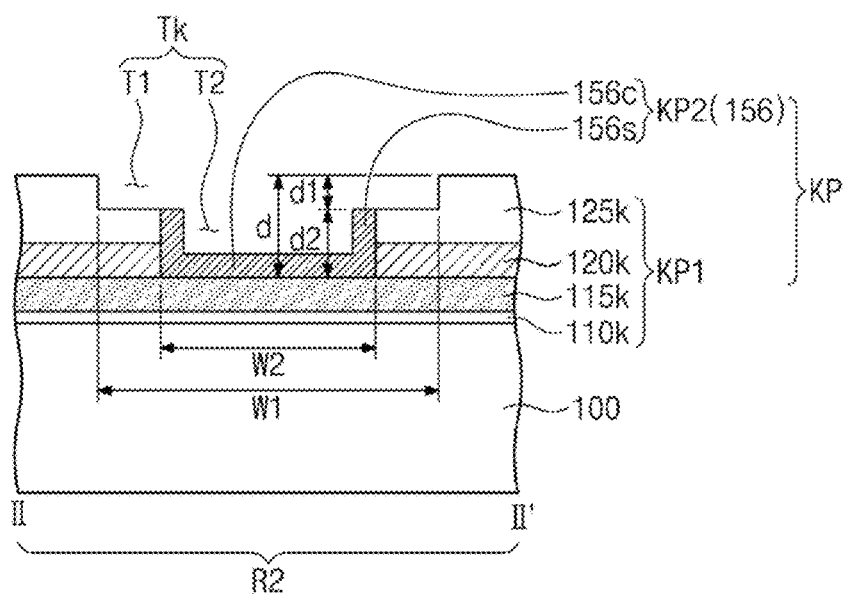
Figure 5C:
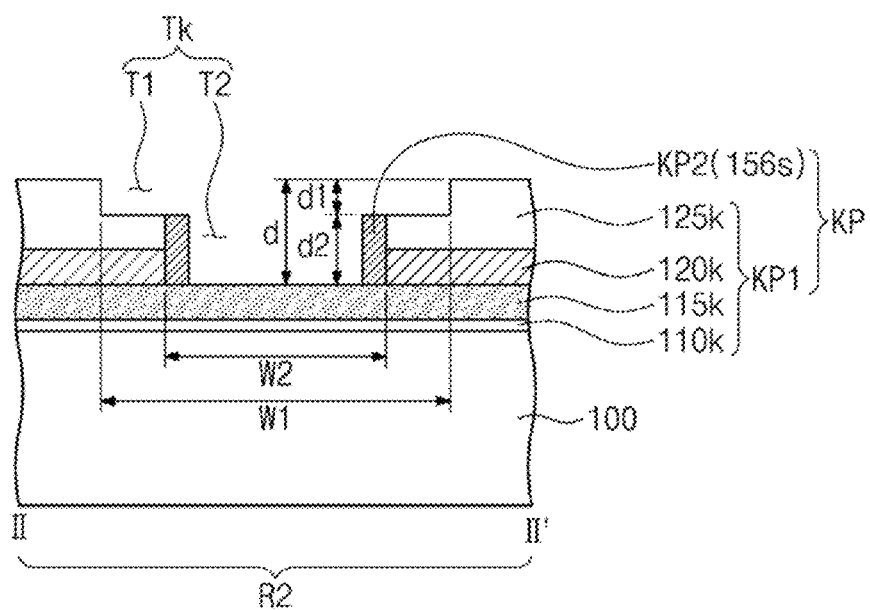

FIGS. 5A to 5C are cross-sectional views, corresponding to line II-II' of FIG. 3, that illustrate other examples of the alignment key shown in FIGS. 3 and 4. For brevity of the description, different configurations will be described.

Referring to FIG. 5A, according to embodiments, the lower conductive pattern 156 of the second sub-alignment key pattern KP2 includes only the sidewall conductive patterns 156s. That is, the interconnect conductive pattern 156c of FIGS. 3 and 4 is omitted. The sidewall conductive patterns 156s are separately disposed on the sidewalls of the lower trench T2. The first conductive pattern 115k have a top surface that defines a floor surface of the lower trench T2 which is exposed through the lower conductive pattern 156.

Referring to FIG. 5B, according to embodiments, the second sub-alignment key pattern KP2 includes only the lower conductive patterns 156. That is, the upper conductive pattern 158 of FIGS. 3 and 4 is omitted.

Referring to FIG. 5C, according to embodiments, the second sub-alignment key pattern KP2 includes only the sidewall conductive patterns 156s. That is, the interconnect conductive pattern 156c and the upper conductive pattern 158 of FIGS. 3 and 4 are omitted.

Figure 15:
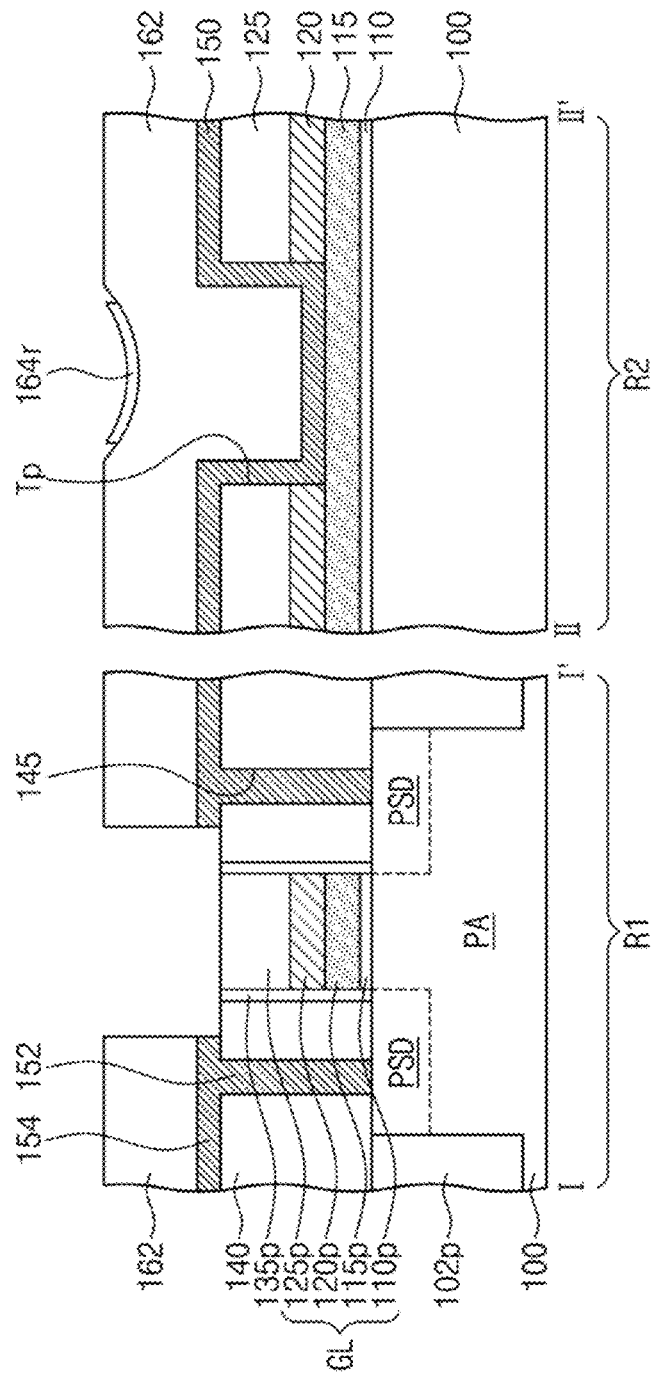
FIGS. 15 and 16 are cross-sectional views, corresponding to lines I-I' and II-II' of FIG. 3, that illustrate comparative examples that are compared with exemplary embodiments of the present inventive concept.
Figure 16:
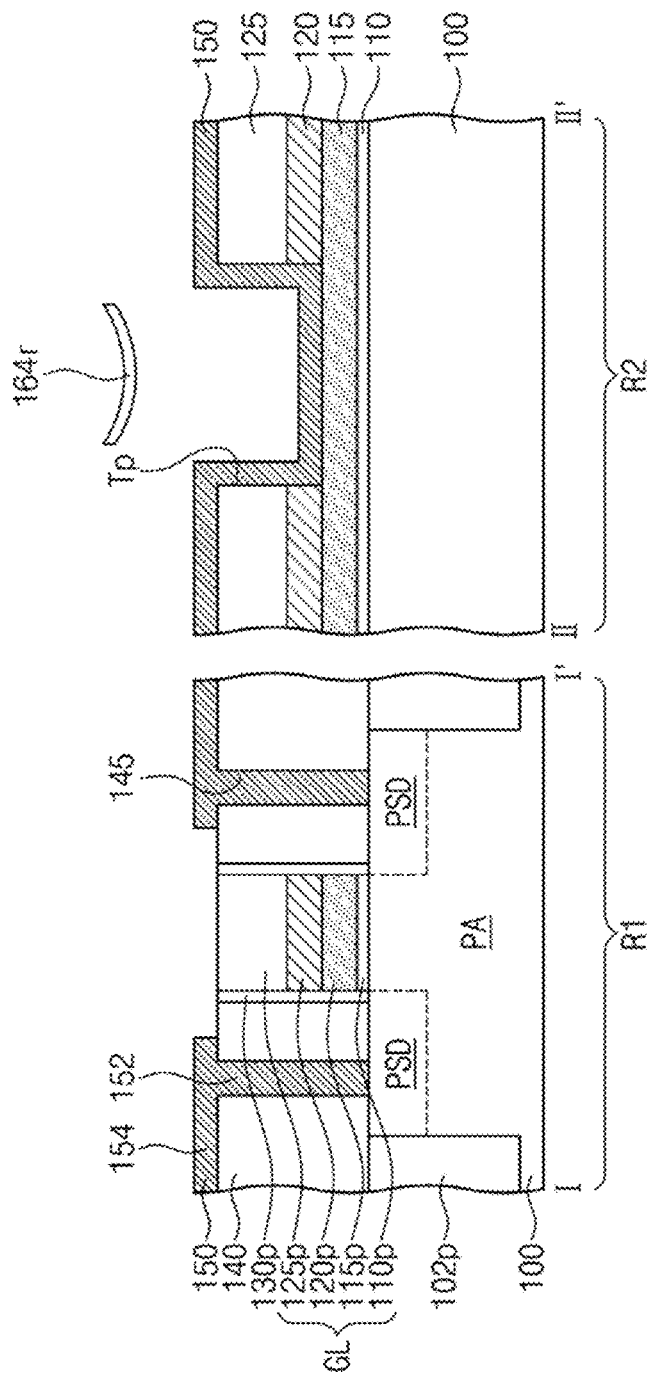

FIGS. 6 to 14 are cross-sectional views, corresponding to lines I-I' and II-II' of FIG. 3, that illustrate a method of fabricating a semiconductor device according to exemplary embodiments of the present inventive concept. FIGS. 15 and 16 are cross-sectional views, corresponding to lines I-I' and II-II' of FIG. 3, that illustrate comparative examples that are compared with exemplary embodiments of the present inventive concept. For brevity of the description, a repetitive explanation will be omitted.

Figure 6:
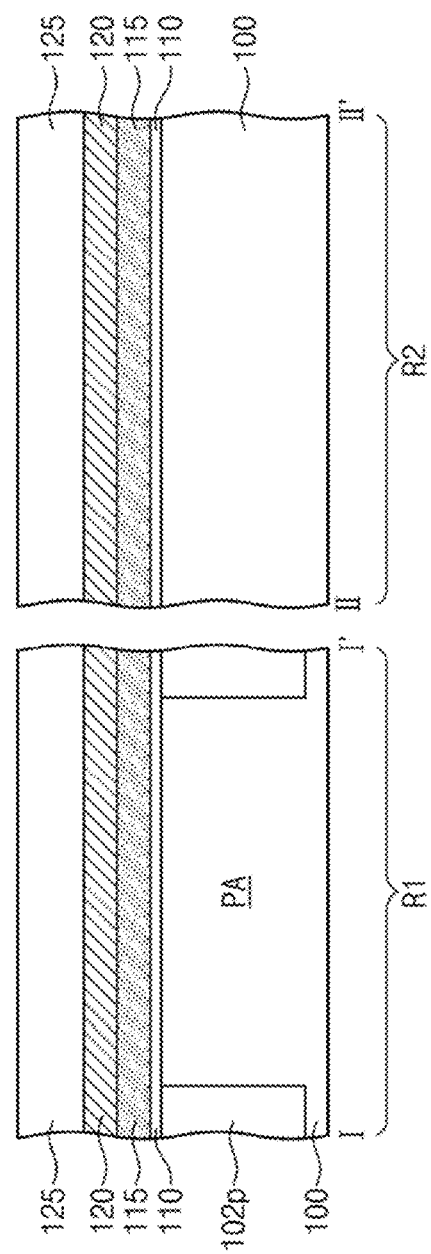
FIGS. 6 to 14 are cross-sectional views, corresponding to lines I-I' and II-II' of FIG. 3, that illustrate a method of fabricating a semiconductor device according to exemplary embodiments of the present inventive concept.

Referring to FIGS. 3 and 6, according to embodiments, a substrate 100 is provided that includes a first region R1 and a second region R2. An active region PA is defined by forming a device isolation pattern 102p in the first region R1 of the substrate 100. For example, a shallow trench isolation (STI) process can be performed to form the device isolation pattern 102p.

According to embodiments, a first dielectric layer 110, a lower conductive layer 115, an upper conductive layer 120, and a second dielectric layer 125 are sequentially formed on the substrate 100. The first dielectric layer 110, the lower conductive layer 115, the upper conductive layer 120, and the second dielectric layer 125 cover all of the first and second regions R1 and R2. The first dielectric layer 110 includes at least one of, for example, silicon oxide, silicon oxynitride, or a high-k dielectric such as a dielectric metal oxide such as hafnium oxide or aluminum oxide that have a dielectric constant greater than that of silicon oxide. For example, the lower conductive layer 115 includes doped polysilicon, and the upper conductive layer 120 includes at least one of a metal such as tungsten, aluminum, titanium, or tantalum, or a conductive metal nitride such as titanium nitride, tantalum nitride, or tungsten nitride. The second dielectric layer 125 includes, for example, silicon oxide, silicon nitride, or silicon oxynitride. The first dielectric layer 110, the lower conductive layer 115, the upper conductive layer 120, and the second dielectric layer 125 can be formed through a deposition process such as CVD or PVD.

Figure 7:
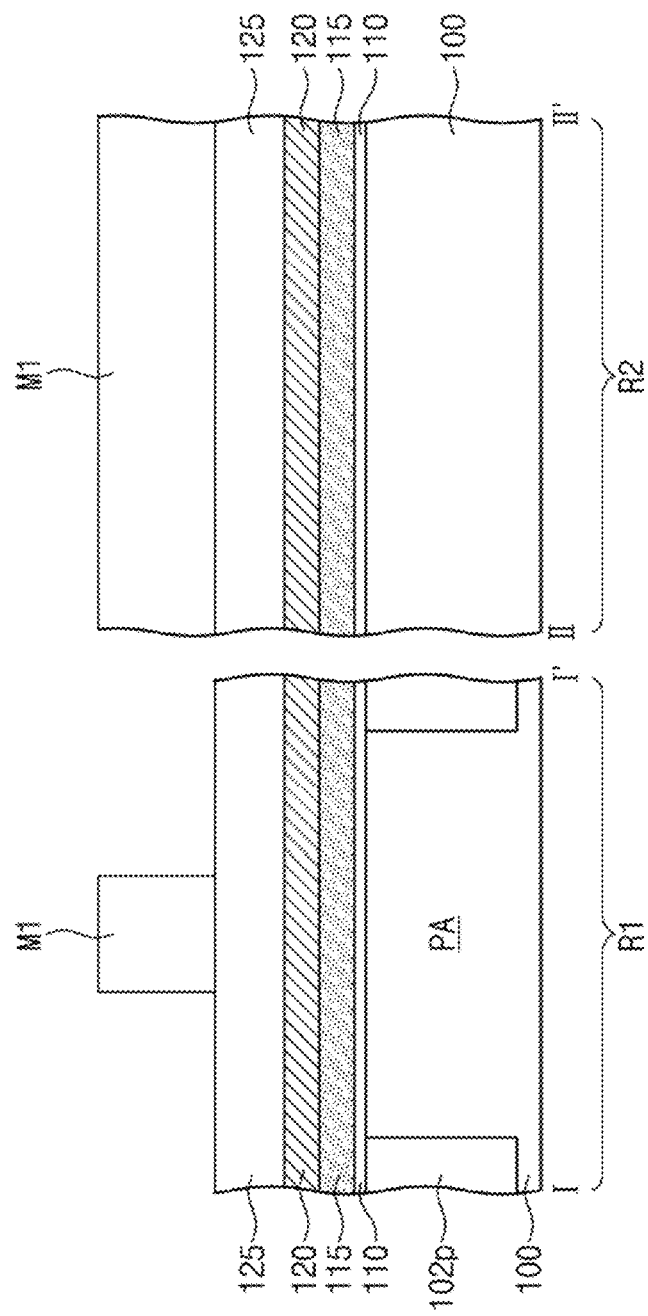

Referring to FIGS. 3 and 7, according to embodiments, a first mask pattern M1 is formed on the substrate 100. The second dielectric layer 125 of the first region R1 includes a portion, where a gate line GL is formed, that is covered by the first mask pattern M1 and a remaining portion that is exposed through the first mask pattern M1. The second dielectric layer 125 of the second region R2 is completely covered by the first mask pattern M1. The first mask pattern M1 includes a hardmask pattern or a photoresist pattern.

Figure 8:
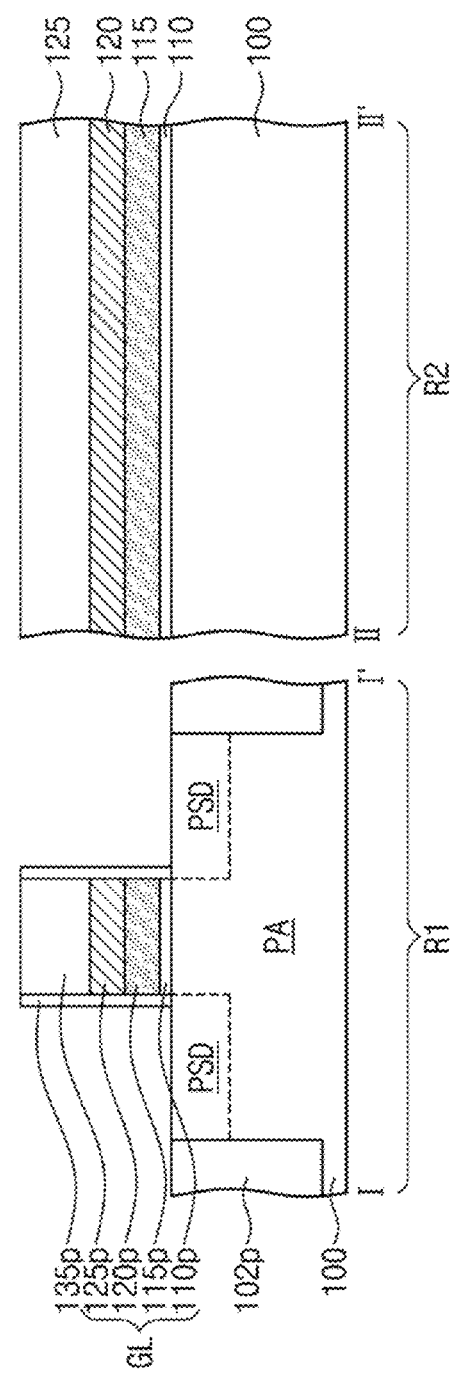

Referring to FIGS. 3 and 8, according to embodiments, the substrate 100 undergoes an etching process using the first mask pattern M1 as an etching mask. A gate line GL is then formed on the substrate 100 of the first region R1. The gate line GL includes a gate dielectric pattern 110p, a lower gate pattern 115p, an upper gate pattern 120p, and a gate capping pattern 125p that are respectively formed by patterning the first dielectric layer 110, the lower conductive layer 115, the upper conductive layer 120, and the second dielectric layer 125 of the first region R1. During the formation of the gate line GL, the first mask pattern M1 protects the layers 110, 115, 120, and 125 of the second region R2. After the formation of the gate line GL, the first mask pattern M1 is removed.

According to embodiments, gate spacers 135p are formed on sidewalk of the gate line GL. For example, the gate spacers 135p can be formed by forming a gate spacer layer on an entire surface of the substrate 100 and then performing a blanket anisotropic etching process. The gate spacer layer includes at least one of silicon oxide, silicon nitride, or silicon oxynitride.

According to embodiments, source/drain regions PSD are formed in the substrate 100 on opposite sides of the gate line GL. For example, the source/drain regions PSD can be formed by an ion implantation process using the gate line GL as an ion implantation mask.

Figure 9:
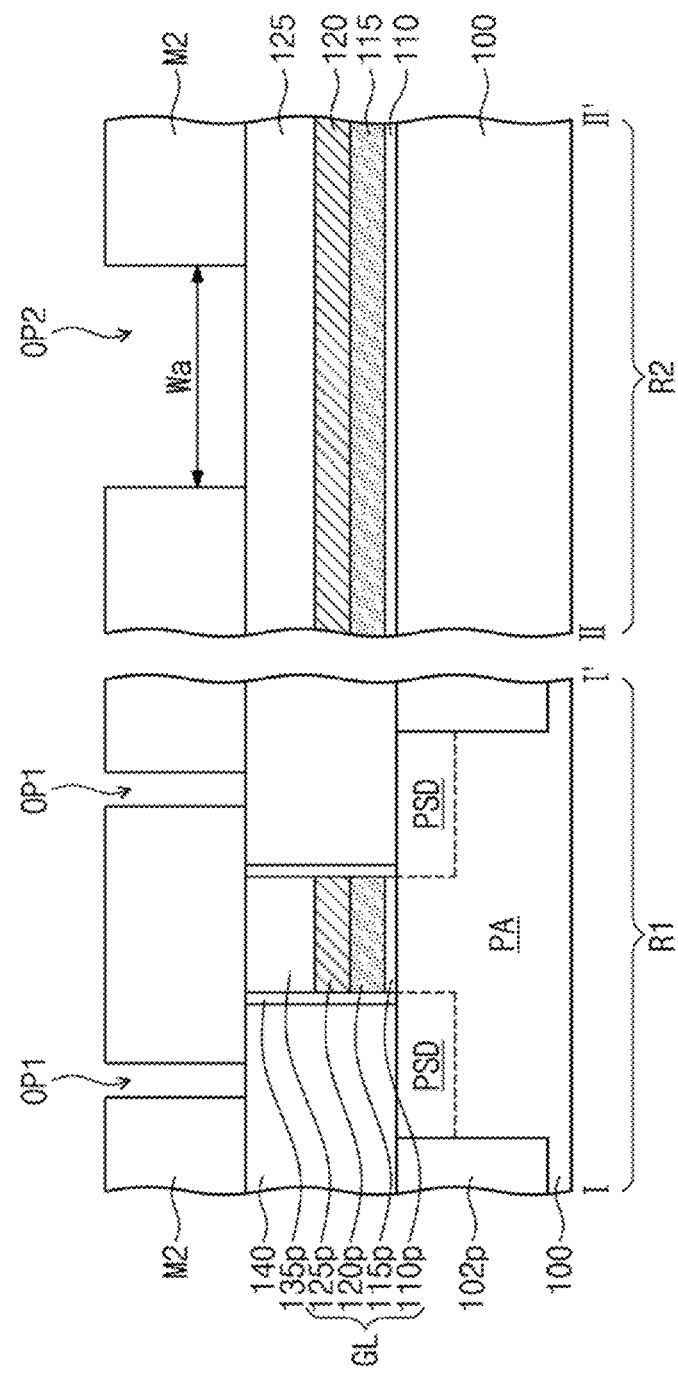

Referring to FIGS. 3 and 9, according to embodiments, a lower interlayer dielectric layer 140 is formed on the substrate 100 of the first region R1. For example, the lower interlayer dielectric layer 140 can be formed by covering the entire surface of the substrate 100 with an insulating layer and then performing a planarization process on the insulating layer to expose a top surface of the gate line GL. As a result, the lower interlayer dielectric layer 140 has a top surface whose height is substantially the same as that of the top surface of the gate line GL. During the planarization process, the lower interlayer dielectric layer 140 is completely removed from the second region R2.

According to embodiments, a second mask pattern M2 is formed on the substrate 100. The second mask pattern M2 has first openings OP1 on the first region R1 and a second opening OP2 on the second region R2. The first openings OP1 are shaped as a hole and overlap the source/drain regions PSD on opposite sides of the gate line GL. The second opening OP2 is a trench that extends in the first direction D1. The second opening OP2 has a width Wa that corresponds to the second width W2 of the lower trench T2 shown in FIGS. 3 and 4. The second mask pattern M2 includes a hardmask pattern or a photoresist pattern.

Figure 10:
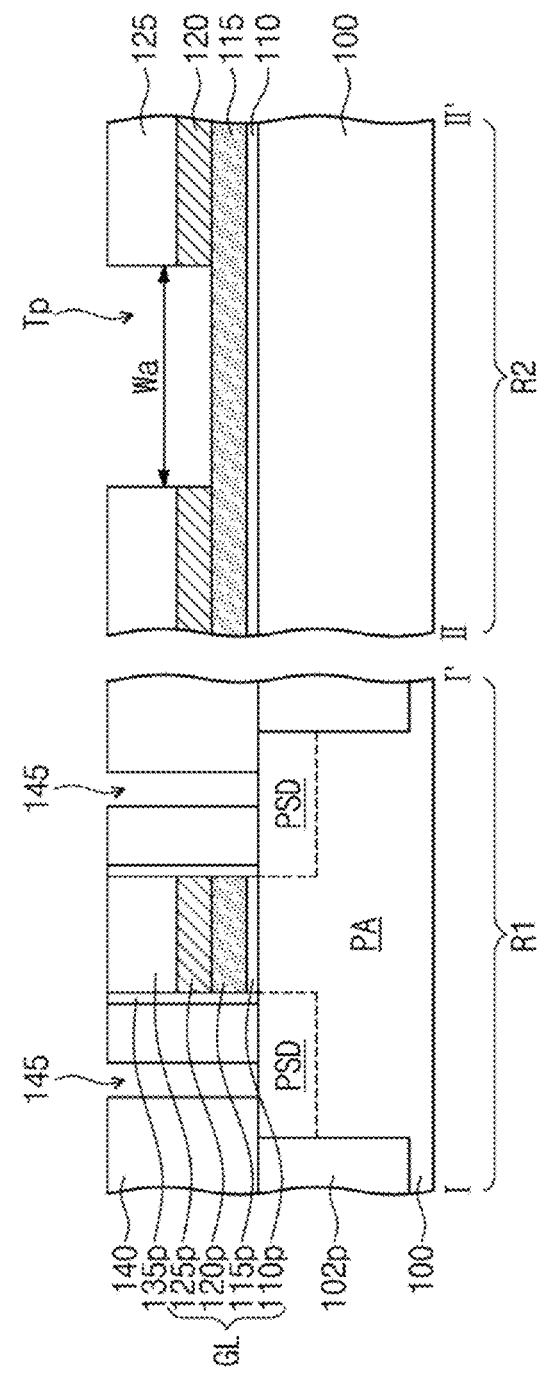

Referring to FIGS. 3 and 10, according to embodiments, an etching process is performed using the second mask pattern M2 as an etching mask to etch the lower interlayer dielectric layer 140 on portions exposed through the first openings OP1. The etching process uses an etchant on the substrate 100 that has a low etch rate and is performed until a top surface of the substrate 100 is exposed. Accordingly, lower contact holes 145 are formed that penetrate the lower interlayer dielectric layer 140 and expose the source/drain regions PSD. The etching process also sequentially etches the second dielectric layer 125 and the upper conductive layer 120 to form a preliminary alignment key trench Tp that exposes the lower conductive layer 115. The lower conductive layer 115 is not removed from the second region R2 during the etching process that forms the lower contact holes 145 since the lower conductive layer 115 is formed of doped polysilicon. In other words, when the preliminary alignment key trench Tp is simultaneously formed with the lower contact holes 145, the lower conductive layer 115 of the second region R2 acts as an etch stop layer. The preliminary alignment key trench Tp has a width that corresponds to the width Wa of the second opening OP2. After forming the lower contact holes 145 and the preliminary alignment key trench Tp, the second mask pattern M2 is removed.

Figure 11:
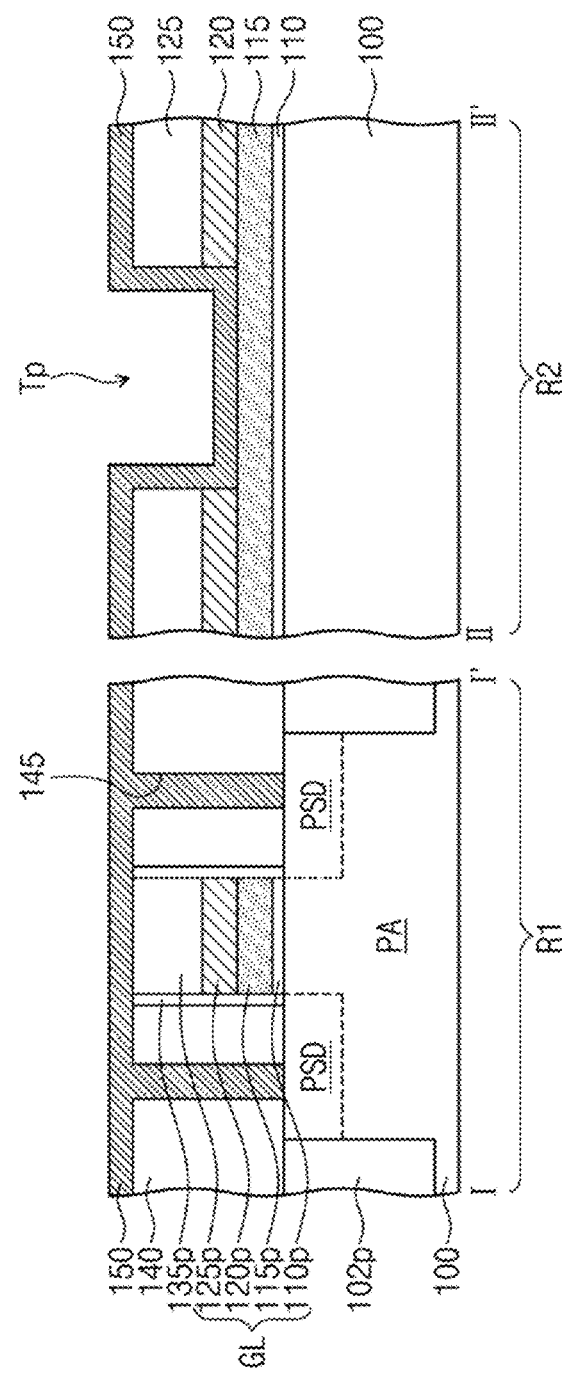

Referring to FIGS. 3 and 11, according to embodiments, a lower interconnect line layer 150 is formed on the substrate 100. The lower interconnect line layer 150 of the first region R1 completely fills the lower contact holes 145 and covers the top surface of the lower interlayer dielectric layer 140. The lower interconnect line layer 150 of the second region R2 partially fills the preliminary alignment key trench Tp and covers a top surface of the second dielectric layer 125. The lower interconnect line layer 150 includes at least one of a metal such as tungsten, titanium, or tantalum, or a conductive metal nitride such as titanium nitride, tantalum nitride, or tungsten nitride.

Figure 12:
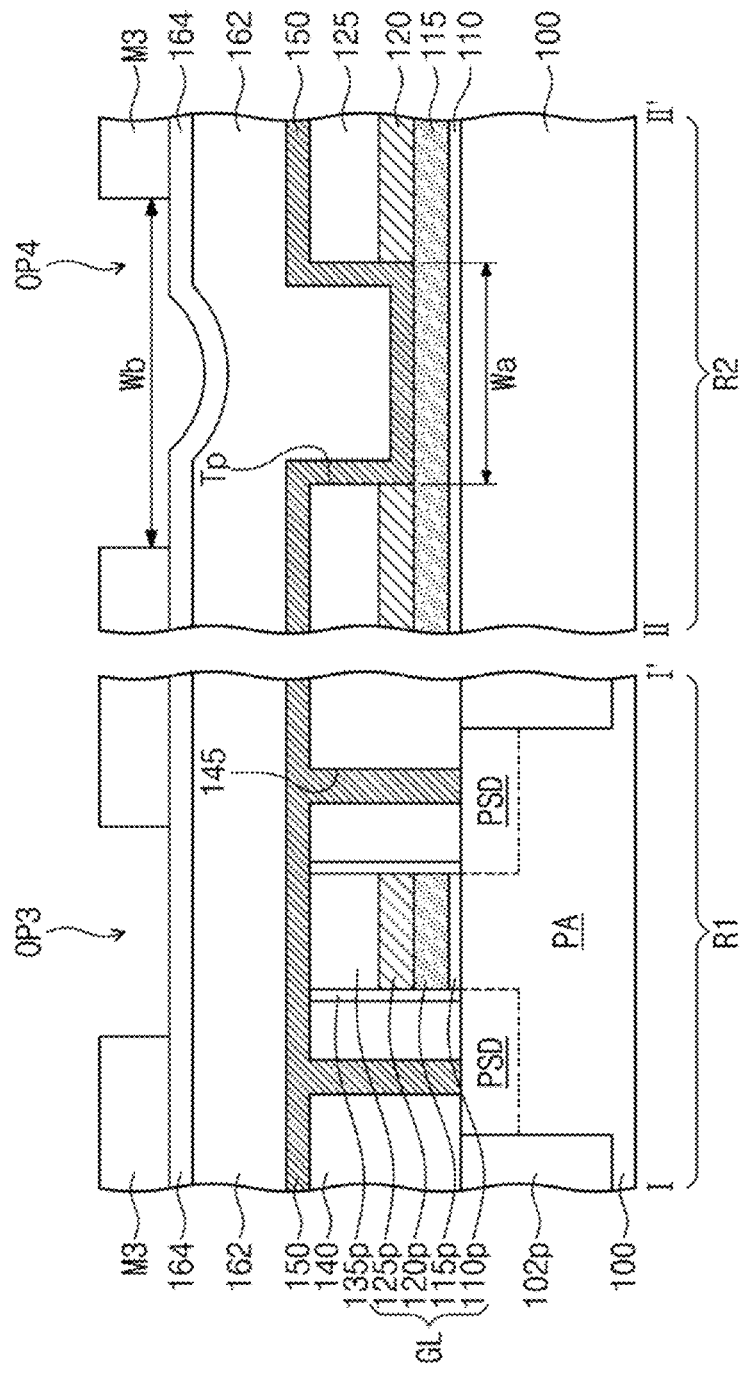

Referring to FIGS. 3 and 12, according to embodiments, an organic mask layer 162 and a hardmask layer 164 are sequentially formed on the substrate 100. The organic mask layer 162 is formed of a material having an etch selectivity with respect to the hardmask layer 164. For example, the organic mask layer 162 can be formed of an SOH (spin on hardmask) layer. The SOH layer may include a carbon-based SOH layer or a silicon-based SOH layer. The hardmask layer 164 includes a silicon oxide layer, a silicon oxynitride layer, or a silicon nitride layer.

According to embodiments, on the first region R1, the organic mask layer 162 and the hardmask layer 164 cover the lower interconnect line layer 150 and have a flat top surface. On the second region R2, the organic mask layer 162 covers the lower interconnect line layer 150 and completely fills the preliminary alignment key trench Tp. The organic mask layer 162 has a stepped top surface on the second region R2. For example, on the second region R2, the organic mask layer 162 has a concave top surface that protrudes toward the substrate 100 at a portion that overlaps the preliminary alignment key trench Tp. On the second region R2, the hardmask layer 164 has a top surface whose profile is substantially the same as that of the top surface of the organic mask layer 162.

According to embodiments, a third mask pattern M3 is formed on the hardmask layer 164. The third mask pattern M3 has a third opening OP3 on the first region R1 and a fourth opening OP4 on the second region R2. On the first region R1, the third opening OP3 overlaps the lower interconnect line layer 150 except at portions to be formed into a lower interconnect line (see 154 of FIG. 14). On the second region R2, the fourth opening OP4 overlaps the stepped surfaces of the organic mask layer 162 and the hardmask layer 164. The fourth opening OP4 extends in the first direction D1 along the preliminary alignment key trench Tp. The fourth opening OP4 has a width Wb greater than the width Wa of the preliminary alignment key trench Tp. The third mask pattern M3 includes, for example, a photoresist pattern.

Figure 13:
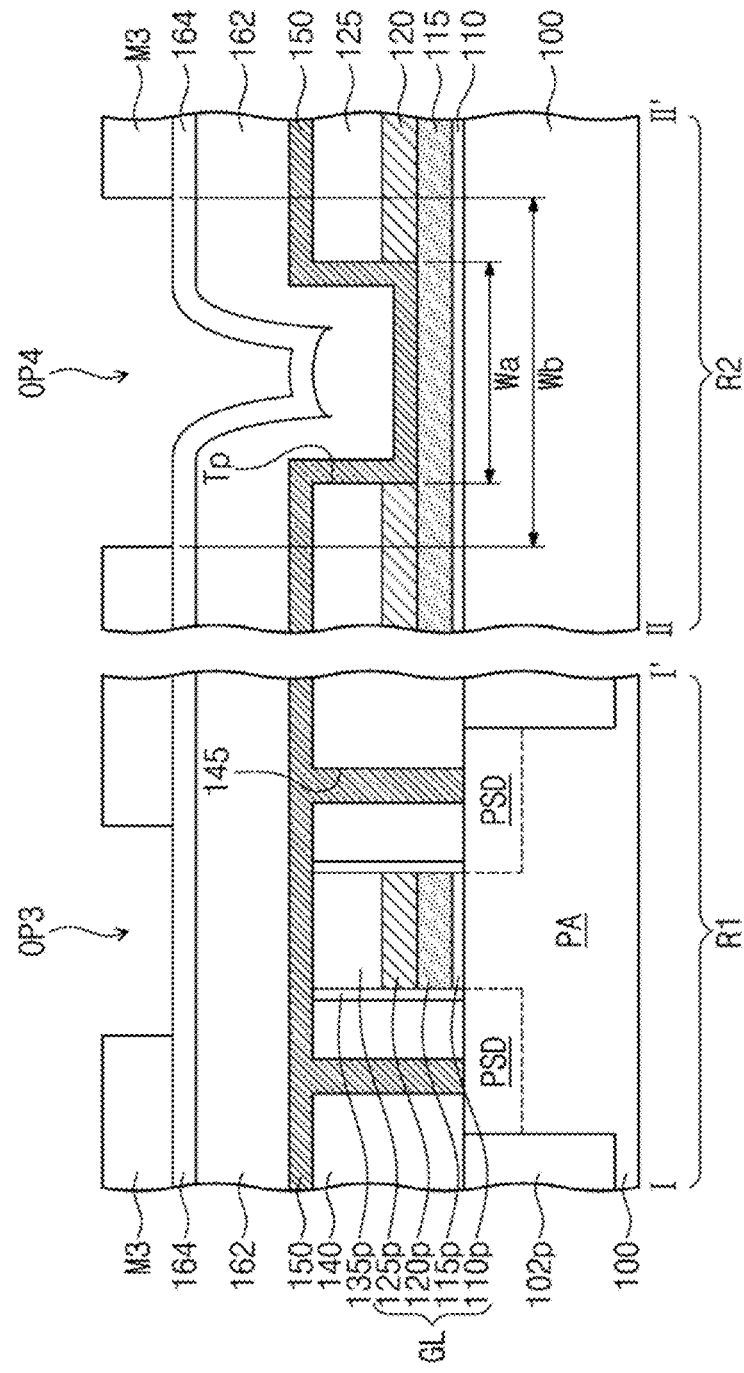

In some embodiments, the organic mask layer 162 includes an organic material formed by a deposition process. For example, the organic mask layer 162 can be formed of an amorphous carbon layer (ACL). In this case, as shown in FIG. 13, the organic mask layer 162 partially fills the preliminary alignment key trench Tp. Likewise as shown in FIG. 12, on the second region R2, the organic mask layer 162 also has a concave top surface at a portion that overlaps the preliminary alignment key trench Tp. The formation of the organic mask layer 162 as shown in FIG. 12 will hereinafter be described in detail.

Figure 14:
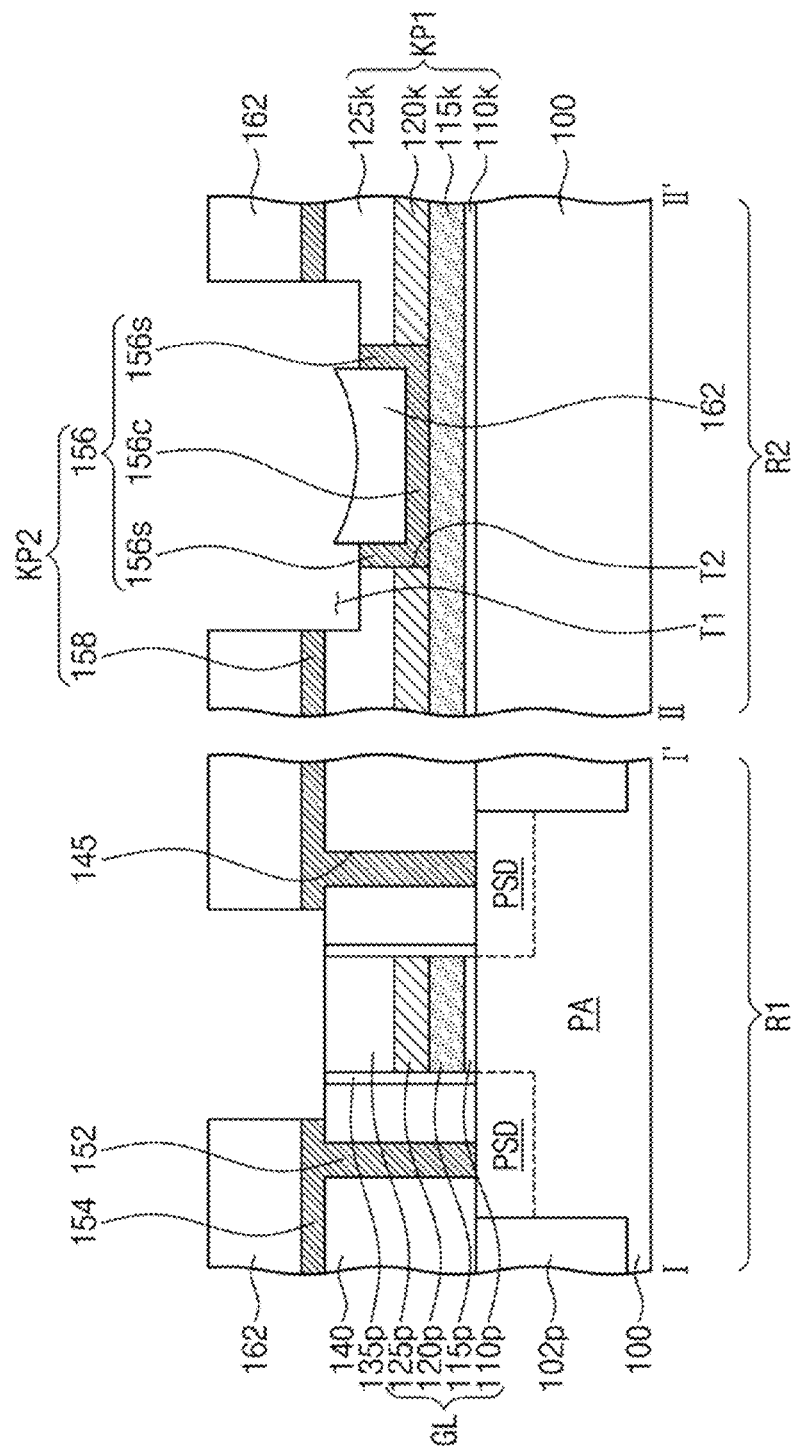

Referring to FIGS. 3 and 14 according to embodiments, the hardmask layer 164, the organic mask layer 162, and the lower interconnect line layer 150 are sequentially etched by an etching process that is performed on the substrate 100 on which the third mask pattern M3 is formed. Consequently, on the first region R1, the lower interconnect line layer 150 on the lower interlayer dielectric layer 140 is patterned to form a lower interconnect line 154. The lower interconnect line layer 150 that remains in the lower contact holes 145 forms the lower contact plugs 152. The lower interconnect line layer 150 of the second region R2 is also patterned to form an upper conductive pattern 158 and a lower conductive pattern 156. When the upper and lower conductive patterns 158 and 156 are formed, the second dielectric layer 125 of the second region R2 is partially etched to form an upper trench T1 in the second dielectric layer 125 of the second region R2. The preliminary alignment key trench Tp has a lower portion below the upper trench T1. The remaining lower portion of the preliminary alignment key trench Tp forms the lower trench T2. On the second region R2, the layers 110, 115, 120, and 125 remain after the lower and upper conductive patterns 156 and 158 are formed. The remaining first dielectric layer 110, lower conductive layer 115, upper conductive layer 120, and second dielectric layer 125 form the buffer dielectric pattern 110$k$, a first conductive pattern 115$k$, a second conductive pattern 120$k$, and a capping dielectric pattern 125$k$. According to exemplary embodiments of the present inventive concept, during the patterning of the lower interconnect line layer 150, the third mask pattern M3 and the hardmask layer 164 are completely removed, but the organic mask layer 162 may remain. An ashing process is used to remove the remaining organic mask layer 162. Through the aforementioned processes, a semiconductor device of FIGS. 3 and 4 can be fabricated.

According to embodiments, to form the lower interconnect line 154, the third mask pattern M3 is formed to completely cover the hardmask layer 164 of the second region R2. In this case, as shown in FIG. 15, a hardmask layer portion 164$r$ may remain on the preliminary alignment key trench Tp even after the lower interconnect line 154 is formed. The presence of the hardmask layer portion 164$r$ may be due to non-uniform etching caused by the stepped profile of the hardmask layer 164. Even though an ashing process is subsequently performed to remove the organic mask layer 162, as shown in FIG. 16, the hardmask layer portion 164$r$ may still remain because of its etch selectivity with respect to the organic mask layer 162. The remaining hardmask layer portion 164$r$ can act as a lifting failure source in subsequent processes. However, according to exemplary embodiments of the present inventive concept, as the third mask pattern M3 has the fourth opening OP4 through which the stepped portion of the hardmask layer 164 is exposed, the hardmask layer 164 is completely removed when the lower interconnect line layer 150 is patterned. Lifting failure due to residue of the hardmask 164 can be prevented from occurring, and thus it is possible to provide a semiconductor device having enhanced process yield and reliability.

According to embodiments, during the steps shown in FIGS. 12 and 14, the lower interconnect line layer 150 can be differently patterned to form the alignment key patterns KP described with reference to FIGS. 5A to 5C.

Figure 17:
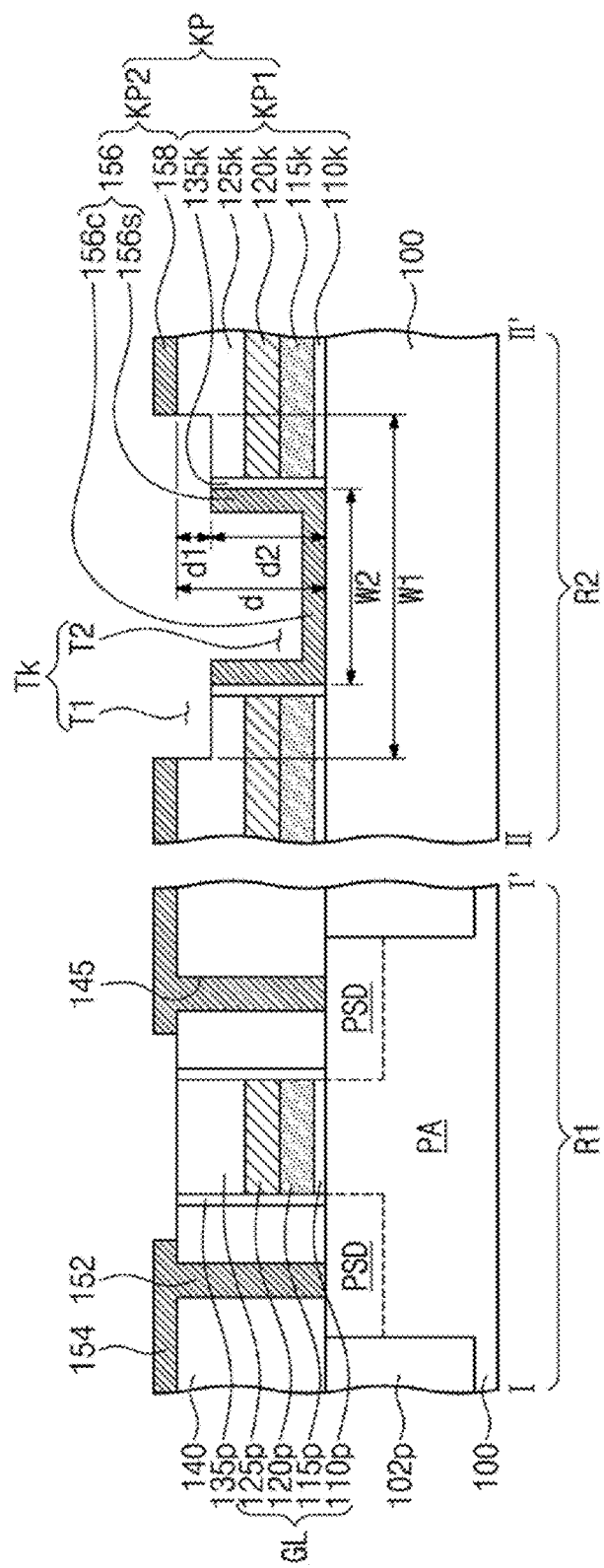
FIG. 17 is a cross-sectional view, corresponding to lines I-I' and II-II' of FIG. 3, that illustrates a semiconductor device according to exemplary embodiments of the present inventive concept.

FIG. 17 is a cross-sectional view, corresponding to lines I-I' and II-II' of FIG. 3, that illustrates a semiconductor device according to exemplary embodiments of the present inventive concept. In the embodiment that follows, the first region R1 is configured substantially the same as that described with reference to FIGS. 3 and 4. The second region R2 is also configured substantially the same as that described with reference to FIGS. 3 and 4, except for differences in the configuration of the first sub-alignment key pattern KP1 and the depth d2 of the lower trench T2. For brevity of the description, different configurations will be principally described.

Referring to FIGS. 3 and 17, according to embodiments, the lower trench T2 that extends downward from the upper trench T1 penetrates the capping dielectric pattern 125k, the second conductive pattern 120k, the first conductive pattern 115k, and the buffer dielectric pattern 110k to expose the substrate 100 through the lower trench T2. In other words, the alignment key trench Tk fully penetrates the first sub-alignment key pattern KP1. The sidewall conductive patterns 156s and the interconnect conductive pattern 156c in the lower trench T2 are therefore be in contact with a top surface of the substrate 100 exposed through the lower trench T2. Although FIG. 17 illustrates the upper trench T1 as having depth d1 that is less than the depth d2 of the lower trench T2, embodiments are not limited thereto. In other embodiments, the depth d1 of the upper trench T1 may be greater than the depth d2 of the lower trench T2.

According to embodiments, the first sub-alignment key pattern KP1 further includes dielectric spacers 135k interposed between one of the sidewall conductive patterns 156s and one of sidewalls of the lower trench T2. That is, the first sub-alignment key pattern KP1 includes the buffer dielectric pattern 110k, the first conductive pattern 115k, the second conductive pattern 120k, the capping dielectric pattern 125k, and further includes the dielectric spacers 135k disposed on sidewalk thereof. The dielectric spacers 135k extend in the first direction D1 along the sidewalls of the lower trench T2. The dielectric spacers 135k include the same material as the gate spacers 135p. For example, the dielectric spacers 135k includes at least one of silicon oxide, silicon nitride, or silicon oxynitride. Other components are substantially the same as those described with reference to FIGS. 3 and 4, and detailed descriptions thereof are omitted.

Figure 18A:
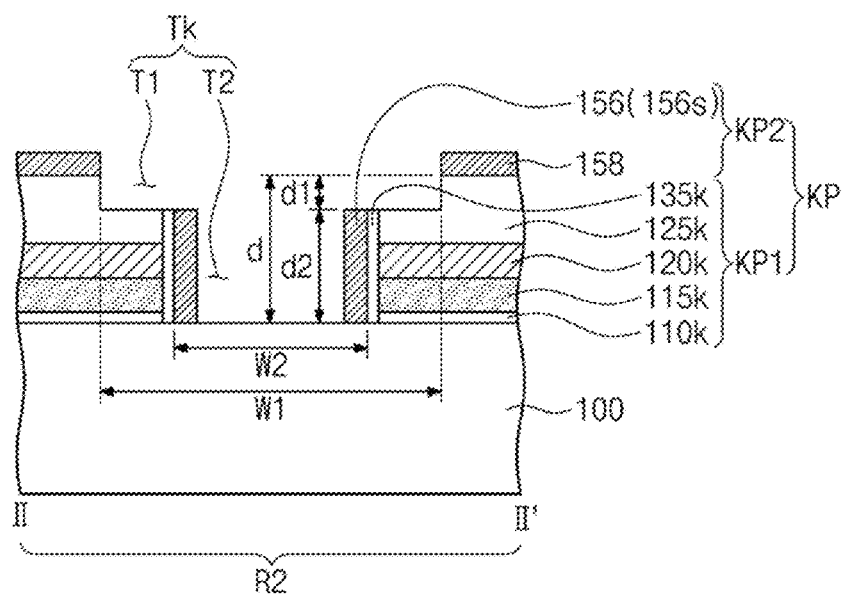
FIGS. 18A to 18C are cross-sectional views, corresponding to line II-II' of FIG. 3, that illustrate other examples of alignment keys shown in FIGS. 3 and 17.
Figure 18B:
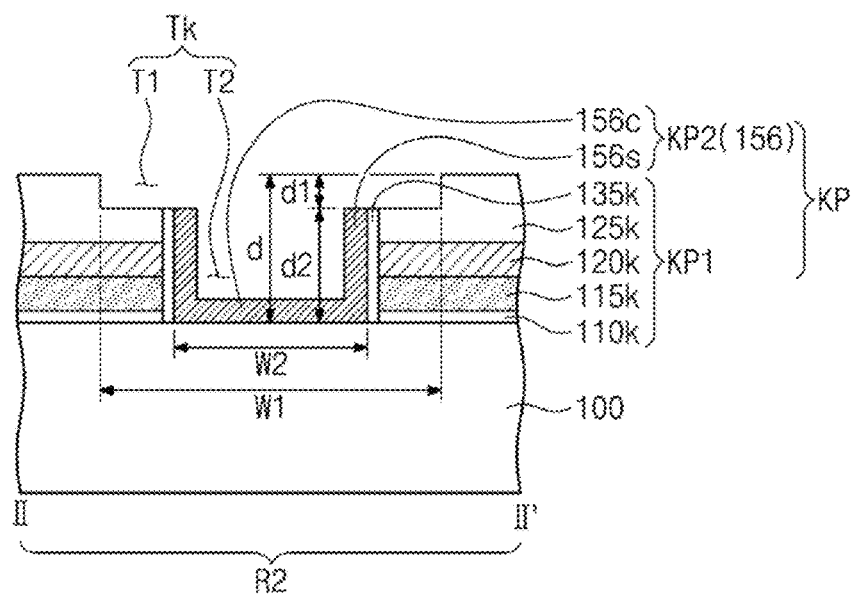
Figure 18C:
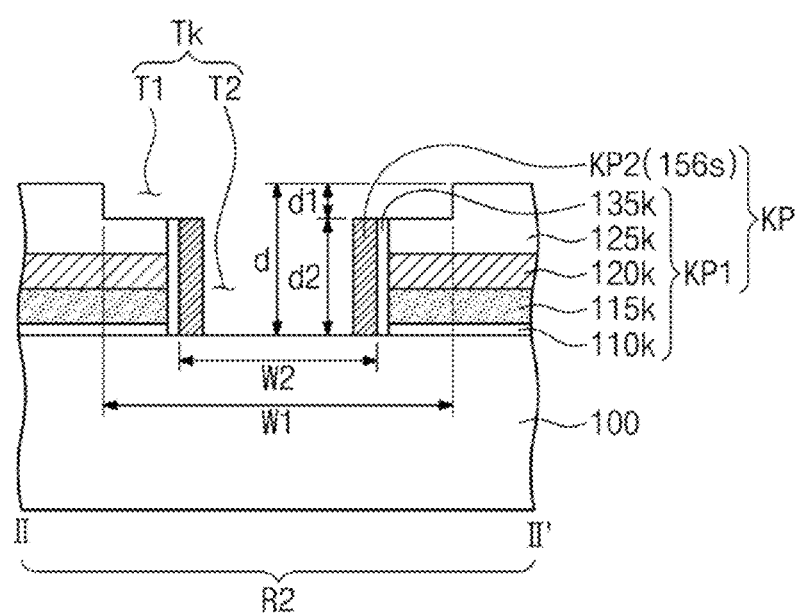

FIGS. 18A to 18C are cross-sectional views, corresponding to line II-II' of FIG. 3, that illustrate other examples of the alignment keys shown in FIGS. 3 and 17. In the embodiments that follow, configurations different from the alignment key of FIGS. 3 and 17 will be principally described for brevity of the description.

Referring to FIG. 18A, according to other embodiments, the lower conductive pattern 156 of the second sub-alignment key pattern KP2 includes only the sidewall conductive patterns 156s. That is, the interconnect conductive pattern 156c of FIGS. 3 and 17 is omitted. The sidewall conductive patterns 156s are separately disposed on the sidewalk of the lower trench T2, and the substrate 100 has an exposed top surface that defines a floor of the lower trench T2.

Referring to FIG. 18B, according to other embodiments, the second sub-alignment key pattern KP2 includes only the lower conductive patterns 156. That is, the upper conductive pattern 158 of FIGS. 3 and 17 is omitted. Referring to FIG. 18C, according to other embodiments, the second sub-alignment key pattern KP2 includes only the sidewall conductive patterns 156s. That is, the interconnect conductive pattern 156c and the upper conductive pattern 158 of FIGS. 3 and 17 are omitted.

FIGS. 19 to 22 are cross-sectional views, corresponding to lines I-I' and II-II' of FIG. 3, that illustrate a method of fabricating a semiconductor device according to exemplary embodiments of the present inventive concept. For brevity of the description, a repetitive explanation will be omitted.

Referring to FIGS. 3 and 19, according to embodiments, a first mask pattern M1a is formed on a resultant structure of FIG. 6. On the first region R1, the second dielectric layer 125 is partially covered with the first mask pattern M1a at a portion where the gate line GL is to be formed. On the second region R2, the first mask pattern M1a includes a fifth opening OP5 through which the second dielectric layer 125 is exposed. The fifth opening OP5 is a trench that extends in the first direction D1. The fifth opening OP5 has a width Wa that corresponds to the second width W2 of the lower trench T2 shown in FIG. 17.

Figure 20:
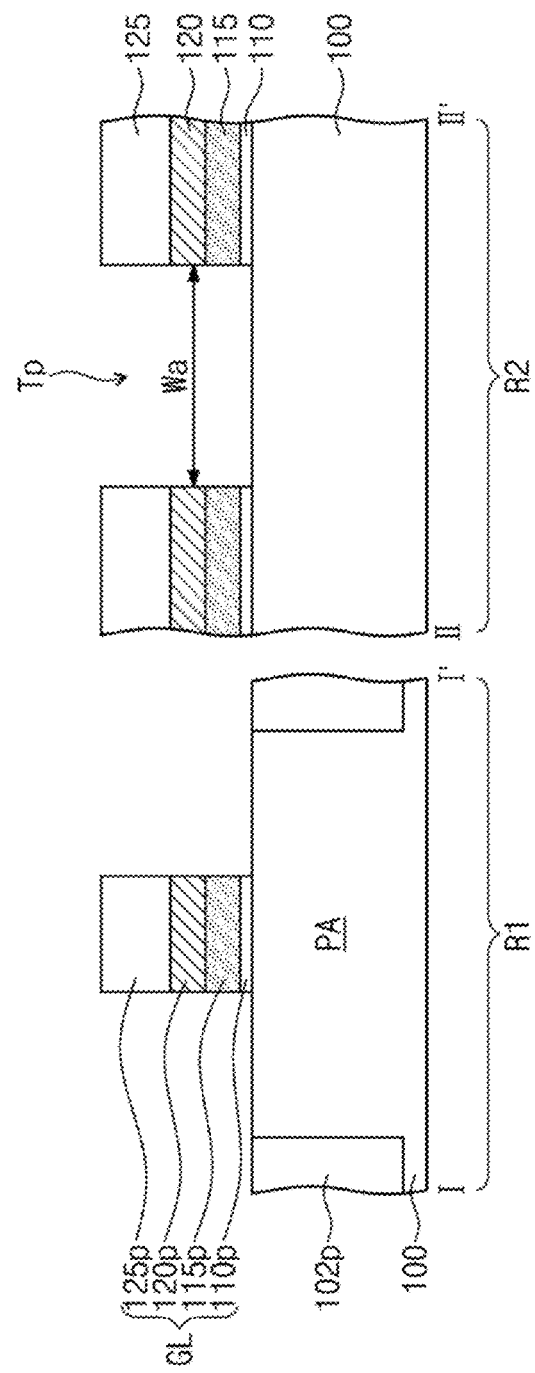

Referring to FIGS. 3 and 20, according to embodiments, the second dielectric layer 125, the upper conductive layer 120, the lower conductive layer 115, and the second dielectric layer 125 are sequentially etched by an etching process using the first mask pattern M1a as an etching mask. The gate line GL is then formed on the substrate 100 of the first region R1. On the second region R2, the preliminary alignment key trench Tp is also formed on the substrate 100 that penetrates the second dielectric layer 125, the upper conductive layer 120, the lower conductive layer 115, and the second dielectric layer 125, to expose a top surface of the substrate 100. According to an embodiment, when the preliminary alignment key trench Tp is formed simultaneously with the gate line GL, the preliminary alignment key trench Tp can be formed deeper than the preliminary alignment key trench Tp of FIG. 10. After forming the gate line GL and the preliminary alignment key trench Tp, the first mask pattern M1a is removed.

Figure 21:
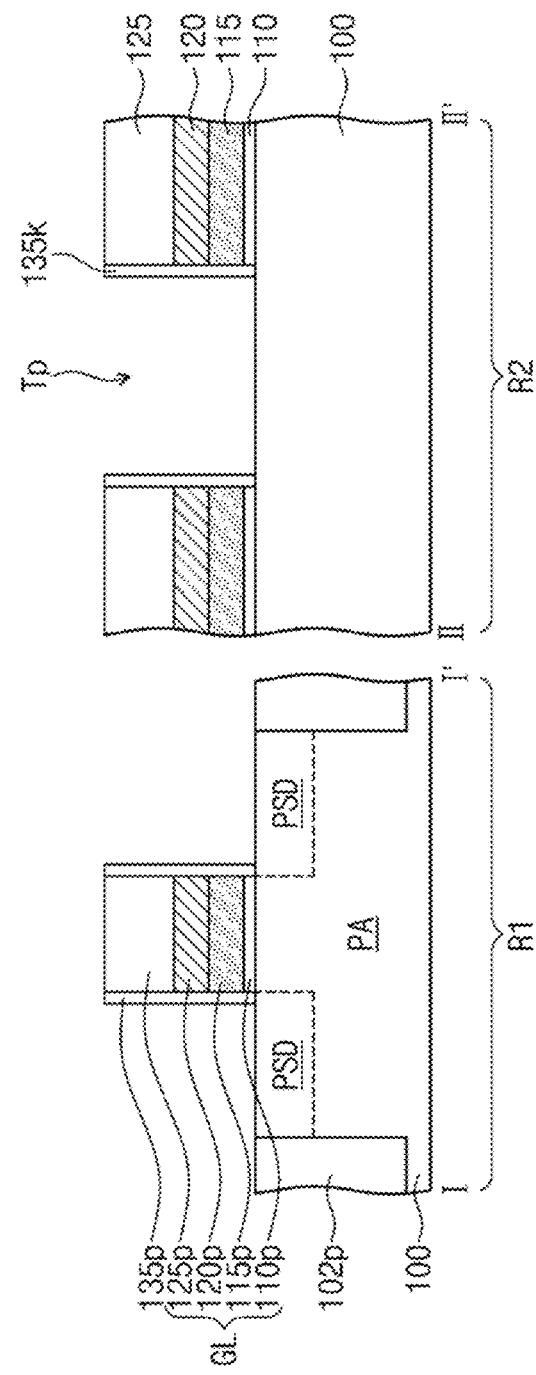

Referring to FIGS. 3 and 21, according to embodiments, the gate spacers 135p are formed on sidewalls of the gate line GL, and the dielectric spacers 135k are formed on sidewalls of the preliminary alignment key trench Tp. For example, the gate spacers 135p and the dielectric spacers 135k can be formed by forming a gate spacer layer on an entire surface of the substrate 100 and then performing a blanket anisotropic etching process. The gate spacer layer may include at least one of silicon oxide, silicon nitride, or silicon oxynitride.

According to embodiments, the source/drain regions PSD are formed in the substrate 100 on opposite sides of the gate line GL. For example, the source/drain regions PSD can be formed by an ion implantation process using the gate line GL as an ion implantation mask.

Figure 22:
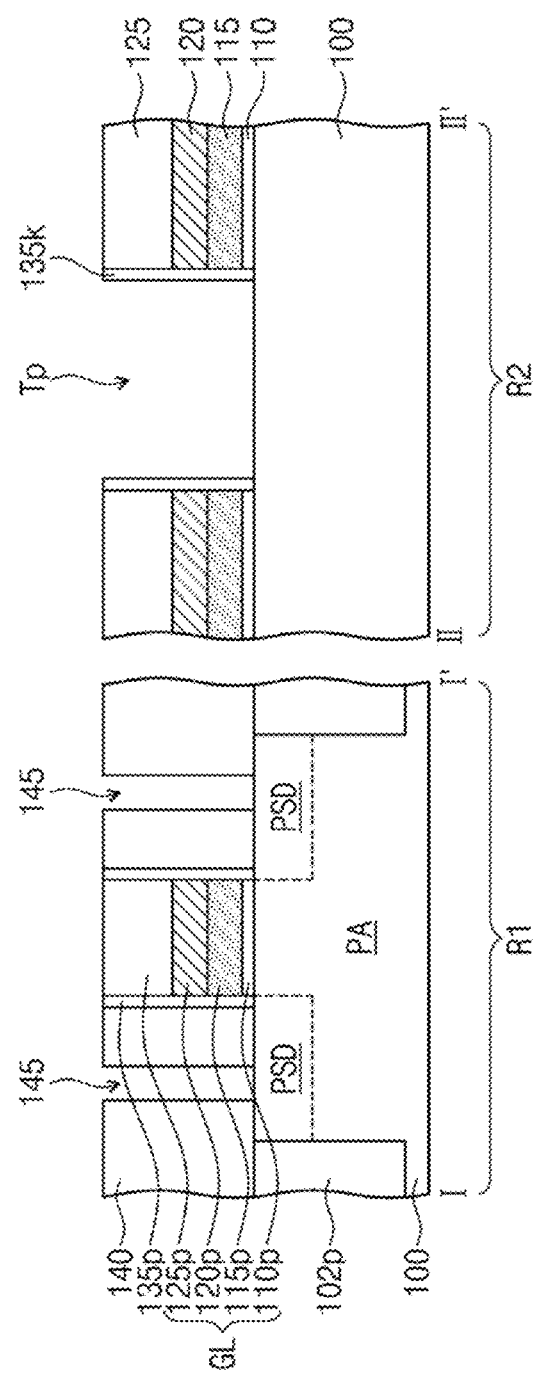

Referring to FIGS. 3 and 22, according to embodiments, the lower interlayer dielectric layer 140 is formed on the substrate 100 of the first region R1. The lower interlayer dielectric layer 140 includes the lower contact holes 145 that expose the source/drain regions PSD. The lower interlayer dielectric layer 140 and the lower contact holes 145 are formed by the same processes as those discussed with reference to FIGS. 9 and 10. The preliminary alignment key trench Tp is filled with the lower interlayer dielectric layer 140, which is removed from the second region R2 during or after the formation of the lower contact holes 145.

Thereafter, according to embodiments, processes identical or similar to those described with reference to FIGS. 11 to 14 may be executed to fabricate the semiconductor device of FIGS. 3 and 17.

Figure 23:
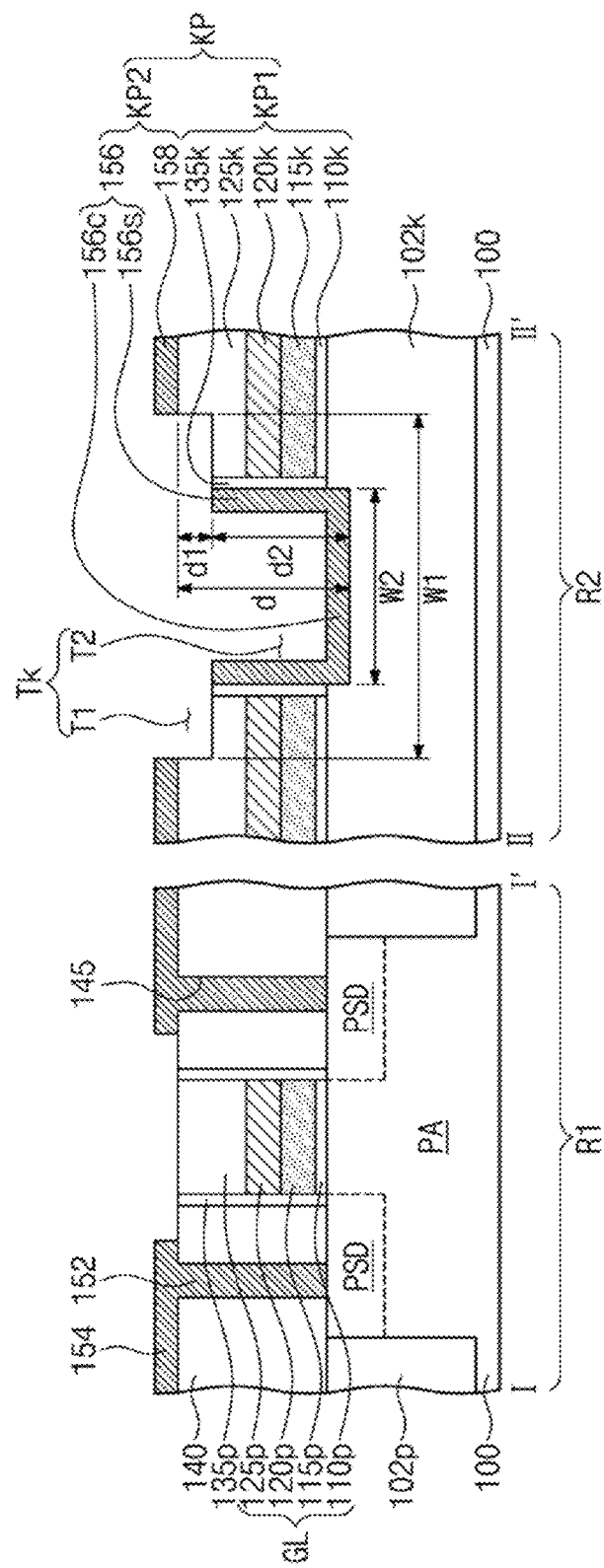
FIG. 23 is a cross-sectional view, corresponding to lines I-I' and II-II' of FIG. 3, that illustrates a semiconductor device according to exemplary embodiments of the present inventive concept.

FIG. 23 is a cross-sectional view, corresponding to lines I-I' and II-II' of FIG. 3, that illustrates a semiconductor device according to exemplary embodiments of the present inventive concept. In the embodiment that follows, the first region R1 is configured substantially the same as that described with reference to FIGS. 3 and 4. The second region R2 is configured substantially the same as that described with reference to FIGS. 3 and 17, except that the alignment key AK is formed in a field region. For brevity of the description, different configurations will be principally explained.

Referring to FIGS. 3 and 23, according to embodiments, the alignment key AK is disposed in a field region, i.e., a buried dielectric pattern 102k. The buried dielectric pattern 102k is formed simultaneously with or after the formation of the device isolation pattern 102p of the first region R1. For example, the buried dielectric pattern 102k can be formed by recessing an upper portion of the substrate 100 of the second region R2 and depositing an insulating layer in the recessed substrate 100 of the second region R2. The buried dielectric pattern 102k and the device isolation pattern 102p include the same material, such as silicon oxide or silicon oxynitride.

According to embodiments, as the alignment key AK is formed on the buried dielectric pattern 102k, the buried dielectric pattern 102k can experience over-etching at its upper portion. As a result, the lower trench T2 may have a floor surface that is recessed into the buried dielectric pattern 102k, and the lower conductive pattern 156 is also formed inside the recessed portion of the buried dielectric pattern 102k. In this configuration, a top surface of the substrate 100 is positioned higher than the floor surface of the lower trench T2 and a bottom surface of the lower conductive pattern 156. Other components are substantially the same as those described with reference to FIGS. 3 and 17, and detailed descriptions thereof are omitted.

Figure 24A:
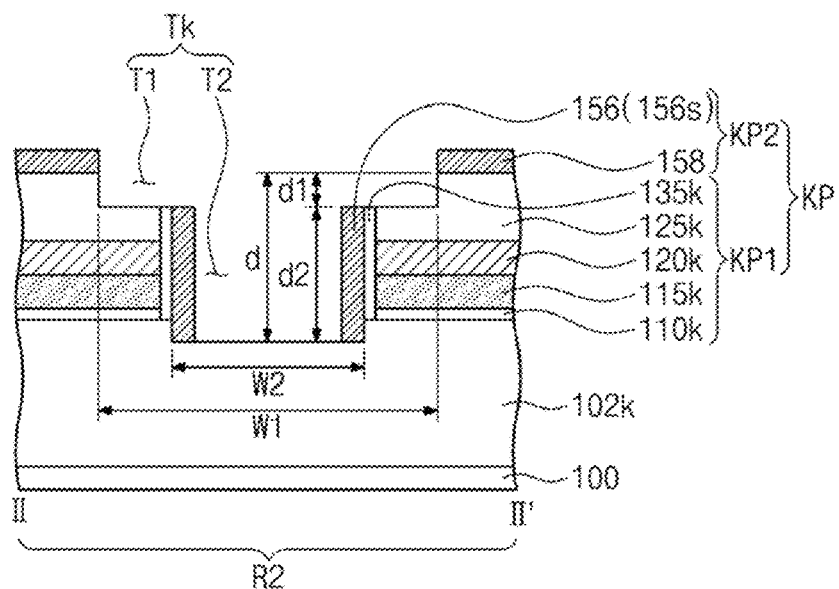
FIGS. 24A to 24C are cross-sectional views, corresponding to lines I-I' and II-II' of FIG. 3, that illustrates a semiconductor device according to exemplary embodiments of the present inventive concept.
Figure 24B:
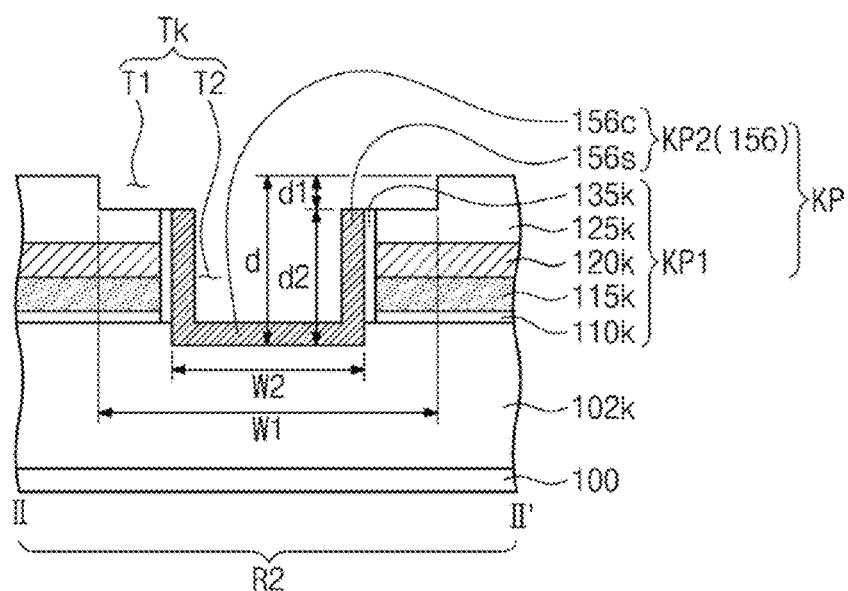
Figure 24C:
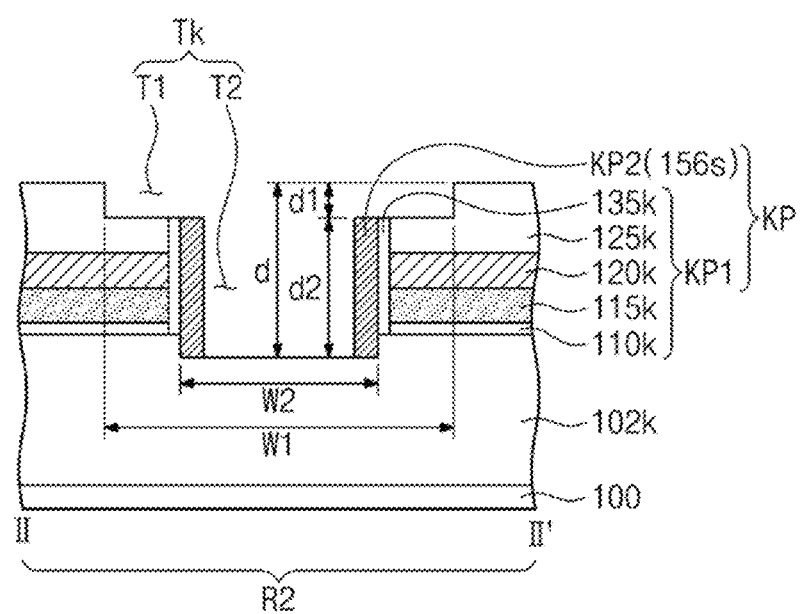

FIGS. 24A to 24C are cross-sectional views, corresponding to line II-II' of FIG. 3, that illustrate other examples of the alignment key shown in FIGS. 3 and 23. Referring to FIGS. 24A to 24C, the examples of FIGS. 18A to 18C can be incorporated into the embodiment of FIG. 23. For example, as shown in FIG. 24A, the lower conductive pattern 156 of the second sub-alignment key pattern KP2 may include only the sidewall conductive patterns 156s. The sidewall conductive patterns 156s may be separately disposed on the sidewalls of the lower trench T2, and the buried dielectric pattern 102k may thus have an exposed top surface that defines the floor of the lower trench T2. Alternatively, as shown in FIG. 24B, the second sub-alignment key pattern KP2 may include only the lower conductive patterns 156. FIG. 24C illustrates another alternative embodiment, in which the second sub-alignment key pattern KP2 includes only the sidewall conductive patterns 156s.

Figure 25:
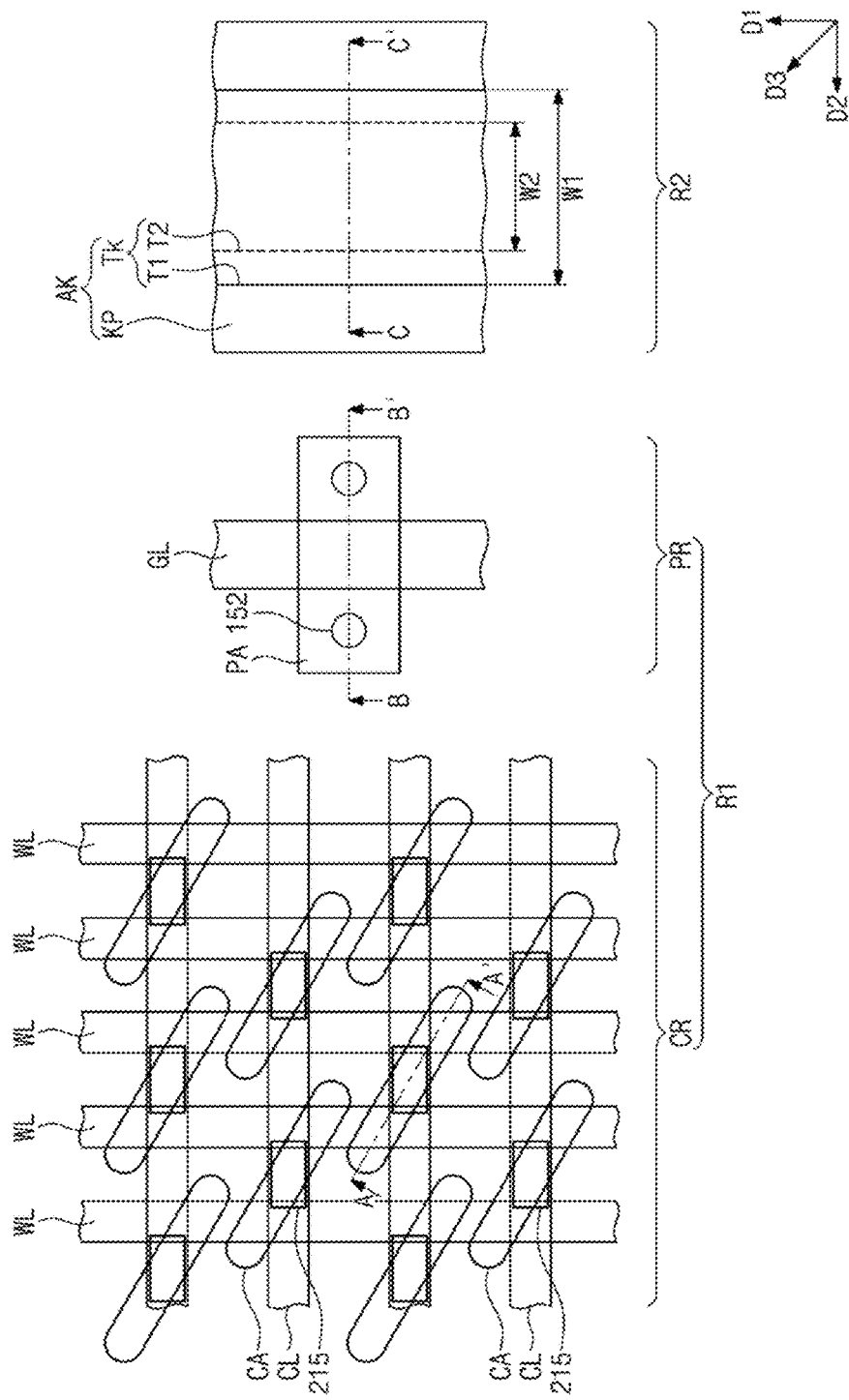
FIG. 25 is a plan view that illustrates a semiconductor device according to exemplary embodiments of the present inventive concept.
Figure 26:
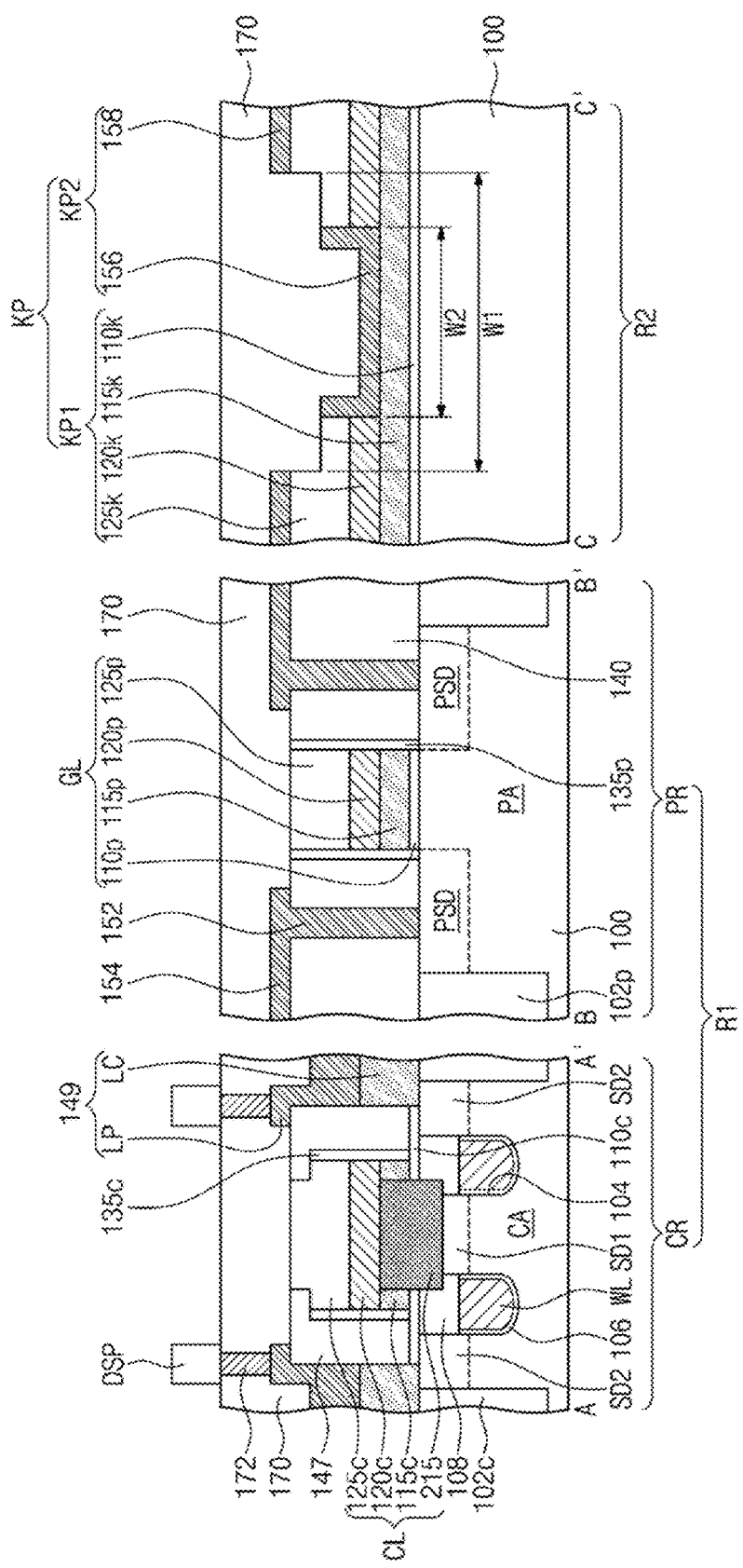
FIG. 26 is a cross-sectional view taken along lines A-A', B-B', and C-C' of FIG. 25.

FIG. 25 is a plan view that illustrates a semiconductor device according to exemplary embodiments of the present inventive concept. FIG. 26 is a cross-sectional view taken along lines A-A', B-B', and C-C' of FIG. 25. For the sake of brevity, a repetitive description will be omitted.

Referring to FIGS. 25 and 26, according to embodiments, a substrate 100 includes a first region R1 and a second region R2. The first region R1 is a portion of the chip zone 12 of FIG. 1, and the second region R2 is a portion of the scribe lane zone 14 of FIG. 1. The first region R1 includes a cell region CR on which memory cells are formed and a peripheral circuit region PR on which peripheral circuits that control the memory cells are formed. The gate line GL, the source/drain regions PSD, the lower contact plugs 152, and the lower interconnect lines 154 are provided on the peripheral circuit region PR, and the alignment key AK is provided on the second region R2. In an embodiment that follows, the peripheral circuit region PR and the second region R2 are configured substantially the same as those of FIGS. 3 and 4, and detailed descriptions thereof are omitted. In addition, the embodiments of the alignment key AK shown in FIGS. 5A to 5C, 17, 18A to 18C, 23, and 24A to 24C can be incorporated into this embodiment.

According to embodiments, the substrate 100 of the cell region CR includes device isolation pattern 102c, which defines cell active regions CA. The cell active regions CA have a bar shape whose longitudinal axis extends in a third direction that crosses the first and second directions D1 and D2, and are arranged parallel to each other.

According to embodiments, word lines WL are provided buried in the substrate 100 of the cell region CR. For example, each of the cell active regions CA crosses a pair of the word lines WL. The word lines WL extend in the first direction D1, and are spaced apart from each other along the second direction D2 perpendicular to the first direction D1. A cell gate dielectric pattern 106 is disposed between the substrate 100 and the word lines WL. The cell gate dielectric pattern 106 includes a dielectric material, such as at least one of a silicon oxide layer, a silicon oxynitride layer, or a high-k dielectric layer. The word lines WL include a conductive material, such as at least one of doped polysilicon, a metal, or a conductive metal nitride. Word line capping, patterns 108 are disposed on the word lines WL. The word line capping pattern 108, the word line WL, and the cell gate dielectric pattern 106 are buried in grooves 104 formed in the substrate 100 of the cell region CR. The word line capping patterns 108 can include, for example, silicon oxide, silicon nitride, or silicon oxynitride.

According to embodiments, each of the cell active regions CA includes a first source/drain region SD1 at a portion between a pair of the grooves 104 and a pair of second source/drain regions SD2 at opposite edges.

According to embodiments, cell conductive lines CL are disposed on the substrate 100 of the cell region CR. The cell conductive lines CL extend side by side in the second direction D2 and cross the word lines WL. Each of the cell conductive lines CL is connected to each of a plurality of first source/drain regions SD1 arranged in the second direction D2. For example, the cell conductive lines CL can be bit lines. Each of the cell conductive lines CL includes a first cell conductive line 115c, a second cell conductive line 120c, and a cell capping line 125c that are sequentially stacked. The first cell conductive line 115c includes the same material as the lower gate pattern 115p or the first conductive pattern 115k. For example, the first cell conductive line 115c can include a doped semiconductor material, such as doped polysilicon. The second cell conductive line 120c includes the same material as the upper gate pattern 120p or the second conductive pattern 120k. For example, the second cell conductive line 120c can include at least one of a metal, such as tungsten, titanium, or tantalum, or a conductive metal nitride, such as titanium nitride, tantalum nitride, and/or tungsten nitride. The cell capping line 125c includes the same material as the gate capping pattern 125p or the capping dielectric pattern 125k. For example, the cell capping line 125c may include silicon oxide, silicon nitride, or silicon oxynitride.

According to embodiments, each of the cell conductive lines CL further includes interconnect contacts 215 at portions that overlap the first source/drain regions SD1, and which penetrate the first cell conductive line 115c. The interconnect contacts 215 include a doped semiconductor material, such as doped silicon. A cell buffer dielectric pattern 110c is interposed between the substrate 100 and the first cell conductive line 115c. The interconnect contacts 215 penetrate the cell buffer dielectric pattern 110c into an upper portion of the substrate 100. The cell buffer dielectric pattern 110c includes silicon oxide.

According to embodiments, cell dielectric liners 135c are disposed on sidewalls the cell conductive lines CL. The cell dielectric liners 135c extend in the second direction D2 along the cell conductive lines CL. The cell dielectric liners 135c include at least one of, for example, silicon oxide, silicon nitride, or silicon oxynitride.

According to embodiments, the substrate 100 of the cell region CR also includes cell contact plugs 149 disposed thereon that are connected to the second source/drain regions SD2. Each of the cell contact plugs 149 includes a cell lower contact LC in contact with the second source/drain region SD2 and a cell upper contact LP on the cell lower contact LC. The cell lower contact LC includes, for example, doped polysilicon. The cell upper contact LP includes the same material as the lower contact plug 152, the lower interconnect line 154, the lower conductive pattern 156, or the upper conductive pattern 158. For example, the cell upper contact LP can include at least one of a metal, such as tungsten, titanium, or, tantalum, or a conductive metal nitride such as titanium nitride, tantalum nitride, or tungsten nitride. Dielectric fences 147 are disposed between the cell contact plugs 149 and the cell conductive lines CL. The dielectric fences 147 include, for example, a silicon nitride layer or a silicon oxynitride layer. A portion of the cell upper contact LP extends onto a top surface of the dielectric fence 147.

According to embodiments, an upper interlayer dielectric layer 170 is disposed on the substrate 100. On the first region R1, the upper interlayer dielectric layer 170 covers the cell upper contacts LP and the lower interconnect lines 154. On the second region R2, the upper interlayer dielectric layer 170 fills the alignment key trench Tk while covering the upper conductive pattern 158. The upper interlayer dielectric layer 170 includes, for example, silicon oxide, silicon nitride, or silicon oxynitride.

According to embodiments, data storage elements DSP are disposed on the upper interlayer dielectric layer 170 of the cell region CR. Each of the data storage elements DSP is a capacitor. For example, the data storage elements DSP can include bottom electrodes each of which is connected to one of the cell upper contacts LP, a top electrode that covers the bottom electrodes, and a dielectric layer interposed between the bottom electrodes and the top electrode. The top electrode is a common electrode that covers the bottom electrodes. In some embodiments, each of the bottom electrodes has a hollow cylindrical shape. The bottom electrodes and the top electrode include a impurity-doped silicon, a metal, or a metal compound. The dielectric layer may be a single layer, or a combination thereof, and includes at least one of a metal oxide such as $HfO_2$, $ZrO_2$, $Al_2O_3$, $La_2O_3$, $Ta_2O_3$, and $TiO_2$, and a perovskite dielectric material such as $SrTiO_3$(STO), $(Ba,Sr)TiO_3$(BST), $BaTiO_3$, PZT, and PLZT. Although FIGS. 25 and 26 show that the data storage elements DSP are connected to the cell upper contact LP through interconnect plugs 172 in the upper interlayer dielectric layer 170, embodiments are not limited thereto.

In some embodiments, each of the data storage elements DSP includes a variable resistance structure. The variable resistance structure can be changed by a programming operation into one of a plurality of states that have different resistance values. In some embodiments, the variable resistance structure is a magnetic tunnel junction pattern that uses its magnetization directions. The magnetic tunnel junction pattern includes a reference magnetic pattern having a unidirectionally fixed magnetization direction, a free magnetic pattern having a magnetization direction that can be changed to be parallel or antiparallel to the magnetization direction of the reference magnetic pattern, and a tunnel barrier between the reference and free magnetic patterns. In other embodiments, the variable resistance structure includes a phase change material. The phase change material can change into an amorphous state or a crystalline state based on the temperature or the time heat is applied by a programming operation. The phase change material has a greater resistivity in the amorphous state than in the crystalline state. For example, the phase change material can include at least one chalcogenide element, such as Te or Se. In some embodiments, the variable resistance structure includes a transition metal oxide. An electrical path can appear or disappear in the transition metal oxide due to a programming operation. The transition metal oxide has a low resistance value when an electrical path is generated and a high resistance value when the electrical path is destroyed.

According to exemplary embodiments of the present inventive concept, the alignment key can be configured to include a trench and completely remove the mask layers from the trench. It is thus possible to suppress lifting failure of the mask layers that are not removed from but remain in the trench. Consequently, a semiconductor device can have enhanced process yield and reliability.

Although embodiments of the present disclosure have been described in connection with the exemplary embodiments as illustrated in the accompanying drawings, it will be understood to those skilled in the art that various changes and modifications may be made without departing from the technical spirit and features of exemplary embodiments of the present disclosure. It thus should be understood that the above-described exemplary embodiments are not limiting but illustrative in all aspects.

What is claimed is:

1. A method of fabricating a semiconductor device, comprising the steps of:

providing a substrate that includes a first region and a second region;

sequentially forming a first dielectric layer, a lower conductive layer, an upper conductive layer, and a second dielectric layer on the substrate;

forming a first mask pattern on the substrate that covers a portion of the second dielectric layer in the first region and completely covers the second dielectric layer in the second region;

etching the substrate using the first mask pattern as an etching mask wherein a gate line is formed in the first region of the substrate, wherein the gate line includes a gate dielectric pattern, a lower gate pattern, an upper gate pattern, and a gate capping pattern that are respectively formed by patterning the first dielectric layer, the lower conductive layer, the upper conductive layer, and the second dielectric layer in the first region;

removing the first mask pattern;

forming source/drain regions in the substrate on opposite sides of the gate line;

forming a lower interlayer dielectric layer on the first region of the substrate;

forming a second mask pattern on the substrate that has first openings on the first region that overlap the source/drain regions and a trench-shaped second opening on the second region;

etching portions of the lower interlayer dielectric layer exposed through the first openings using the second mask pattern to form lower contact holes that penetrate the lower interlayer dielectric layer and expose the source/drain regions, wherein the second dielectric layer and the upper conductive layer of the second region are sequentially etched to form a preliminary alignment key trench that exposes the lower conductive layer; and removing the second mask pattern.

2. The method of claim 1, wherein the first mask pattern in the second region includes a fifth opening through which the second dielectric layer is exposed, wherein etching the substrate using the first mask pattern as the etching mask forms the preliminary alignment key trench in the second region of the substrate that penetrates the second dielectric layer, the upper conductive layer, the lower conductive layer, and the second dielectric layer, to expose a top surface of the substrate.

3. The method of claim 1, wherein the first mask pattern protects the first dielectric layer, the lower conductive layer, the upper conductive layer, and the second dielectric layer of the second region when etching the substrate with the first mask pattern.

4. The method of claim 1, wherein the method further comprises:

forming a lower interconnect line layer over the substrate, wherein the lower interconnect line layer of the first region completely fills the lower contact holes and covers a top surface of the lower interlayer dielectric layer, and the lower interconnect line layer of the second region partially fills the preliminary alignment key trench and covers a top surface of the second dielectric layer;

sequentially forming an organic mask layer and a hardmask layer on the substrate, wherein the organic mask layer is formed of a material having an etch selectivity with respect to the hardmask layer, wherein on the first region, the organic mask layer and the hardmask layer cover the lower interconnect line layer, and on the second region, the organic mask layer covers the lower interconnect line layer and fills the preliminary alignment key trench; and forming a third mask pattern on the hardmask layer that has a third opening on the first region and a fourth opening on the second region that extends along the preliminary alignment key trench.

5. The method of claim 4, further comprising sequentially etching the hardmask layer, the organic mask layer, and the lower interconnect line layer using the third mask pattern as a pattern mask to form a lower interconnect line in the first region from the lower interconnect line layer, wherein the lower interconnect line layer that remains in the lower contact holes forms lower contact plugs, and the lower interconnect line layer of the second region is patterned to form an upper conductive pattern and a lower conductive pattern, wherein the second dielectric layer of the second region is partially etched to form an upper trench in the second dielectric layer of the second region, wherein a remaining portion of the preliminary alignment key trench below the upper trench forms a lower trench, and wherein the third mask pattern and the hardmask layer are completely removed; and removing the organic mask layer.

6. The method of claim 5, wherein removing the organic mask layer is performed by an asking process.

7. The method of claim 5, wherein the sequentially etching of the hardmask layer, the organic mask layer, and the lower interconnect line layer using the third mask pattern leaves a portion of the organic mask layer in the lower trench.

8. The method of claim 7, wherein an upper end of the portion of the organic mask layer in the lower trench is higher than a bottom surface of the upper trench.

9. The method of claim 4, wherein the organic mask layer comprises SOH (spin on hardmask) layer or an amorphous carbon layer.

10. A method of fabricating a semiconductor device, comprising the steps of:

forming a structure having a preliminary trench on a substrate;

sequentially forming a lower interconnect line layer, an organic mask layer and a hardmask layer on the structure;

forming a mask pattern having an opening on the hardmask layer wherein the opening overlaps the preliminary trench and is wider than the preliminary trench; and sequentially etching the hardmask layer, the organic mask layer, and the lower interconnect line layer using the mask pattern as a pattern mask to form an upper conductive pattern and a lower conductive pattern, wherein an upper portion of the structure is etched to from an upper trench in the structure, a remaining portion of the preliminary trench below the upper trench forms a lower trench, and a portion of the organic mask layer remains in the lower trench.

11. The method of claim 10, wherein an upper end of the portion of the organic mask layer in the lower trench is higher than a bottom surface of the upper trench.

12. The method of claim 10, wherein the sequentially etching of the hardmask layer, the organic mask layer, and the lower interconnect line layer, comprises completely removing the mask pattern and the hardmask layer, and the method further comprising removing the organic mask layer.

* * * * *